US010535738B2

(12) United States Patent
Hsiao et al.

(10) Patent No.: US 10,535,738 B2
(45) Date of Patent: Jan. 14, 2020

(54) SEMICONDUCTOR STRUCTURE AND MANUFACTURING METHOD OF THE SAME

(71) Applicant: TAIWAN SEMICONDUCTOR MANUFACTURING COMPANY LTD, Hsinchu (TW)

(72) Inventors: Meng-Hsuan Hsiao, Hsinchu (TW); Winnie Victoria Wei-Ning Chen, Milpitas, CA (US); Tung Ying Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/879,888

(22) Filed: Jan. 25, 2018

(65) Prior Publication Data

US 2019/0131405 A1 May 2, 2019

Related U.S. Application Data

(60) Provisional application No. 62/579,422, filed on Oct. 31, 2017.

(51) Int. Cl.
| H01L 21/332 | (2006.01) |
| H01L 29/10 | (2006.01) |
| H01L 21/8238 | (2006.01) |
| H01L 29/06 | (2006.01) |
| H01L 29/165 | (2006.01) |
| H01L 27/092 | (2006.01) |

(Continued)

(52) U.S. Cl.
CPC .. *H01L 29/1083* (2013.01); *H01L 21/823807* (2013.01); *H01L 21/823821* (2013.01); *H01L 27/092* (2013.01); *H01L 27/0924* (2013.01); *H01L 29/0673* (2013.01); *H01L 29/165* (2013.01); *H01L 29/66742* (2013.01); *H01L 29/78684* (2013.01); *H01L 29/78696* (2013.01)

(58) Field of Classification Search
CPC .................. H01L 21/823821; H01L 27/0924
See application file for complete search history.

(56) References Cited

U.S. PATENT DOCUMENTS

| 9,209,247 B2 | 12/2015 | Colinge et al. |
| 9,236,267 B2 | 1/2016 | De et al. |
| 9,412,817 B2 | 8/2016 | Yang et al. |

(Continued)

*Primary Examiner* — Samuel A Gebremariam
(74) *Attorney, Agent, or Firm* — Birch, Stewart, Kolasch & Birch, LLP

(57) ABSTRACT

Present disclosure provides a semiconductor structure including a first transistor and a second transistor. The first transistor includes a semiconductor substrate having a top surface and a first anti-punch through region doped with a first conductivity dopant at the top surface. The first transistor further includes a first channel over the top surface of the semiconductor substrate by a first distance. The second transistor includes a second anti-punch through region doped with a second conductivity dopant at the top surface of the semiconductor substrate. The second transistor further includes a second channel over the top surface of the semiconductor substrate by a second distance greater than the first distance. Present disclosure also provides a method for manufacturing the semiconductor structure described herein.

20 Claims, 22 Drawing Sheets

(51) Int. Cl.
*H01L 29/786* (2006.01)
*H01L 29/66* (2006.01)

(56) References Cited

U.S. PATENT DOCUMENTS

| | | |
|---|---|---|
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2015/0214365 A1* | 7/2015 | Xie .................... H01L 29/7842 257/369 |
| 2016/0104765 A1* | 4/2016 | Ching ............. H01L 21/823431 257/29 |

* cited by examiner

US 10,535,738 B2

SEMICONDUCTOR STRUCTURE AND MANUFACTURING METHOD OF THE SAME

CROSS REFERENCE TO RELATED APPLICATIONS

This application claims the benefit of prior-filed provisional application No. 62/579,422, filed Oct. 31, 2017.

BACKGROUND

Metal-oxide-semiconductor field effect transistors (MOSFETs) are used in ultra-large scale integrated (ULSI) circuits, which are found in today's semiconductor integrated circuit (IC) chip products. The gate length of the MOSFET is continuously being scaled down for faster circuit speed, higher circuit density and increased functionality, and lower cost per unit function. As the gate length of the MOSFET is scaled into the sub-20 nm regime, the source and drain increasingly interact with the channel to substantially influence the channel potential. Hence, a transistor with a short gate length often suffers from problems related to the inability of the gate to substantially control the on/off states of the channel. Phenomena related to the reduced gate control of the channel potential are called short-channel effects.

Increased body doping concentration, reduced gate oxide thickness, and junction depths are some ways to suppress short-channel effects. However, for device scaling well into the sub-20 nm regime, the requirements for body-doping concentration, gate oxide thickness, and source/drain doping profiles become increasingly difficult to meet using conventional device structures based on bulk silicon substrates. Therefore, alternative device structures that offer better control of short-channel effects are being considered to enable the continued scaling down of transistor sizes.

A highly scalable device structure that offers superior control of short-channel effects is a wrap-around gate structure for a transistor (a.k.a., surround-gate or gate-all-around transistor structure). A wrap-around gate structure typically has a gate that surrounds or wraps around a channel region. This structure effectively improves the capacitance coupling between the gate and the channel, as compared to conventional bulk silicon substrate transistor structures, double-gate transistor structures, and triple-gate transistor structures. With the wrap-around gate structure, the gate gains significant influence on the channel potential, and therefore improves suppression of short-channel effects.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION OF THE DISCLOSURE

Figure 1B:
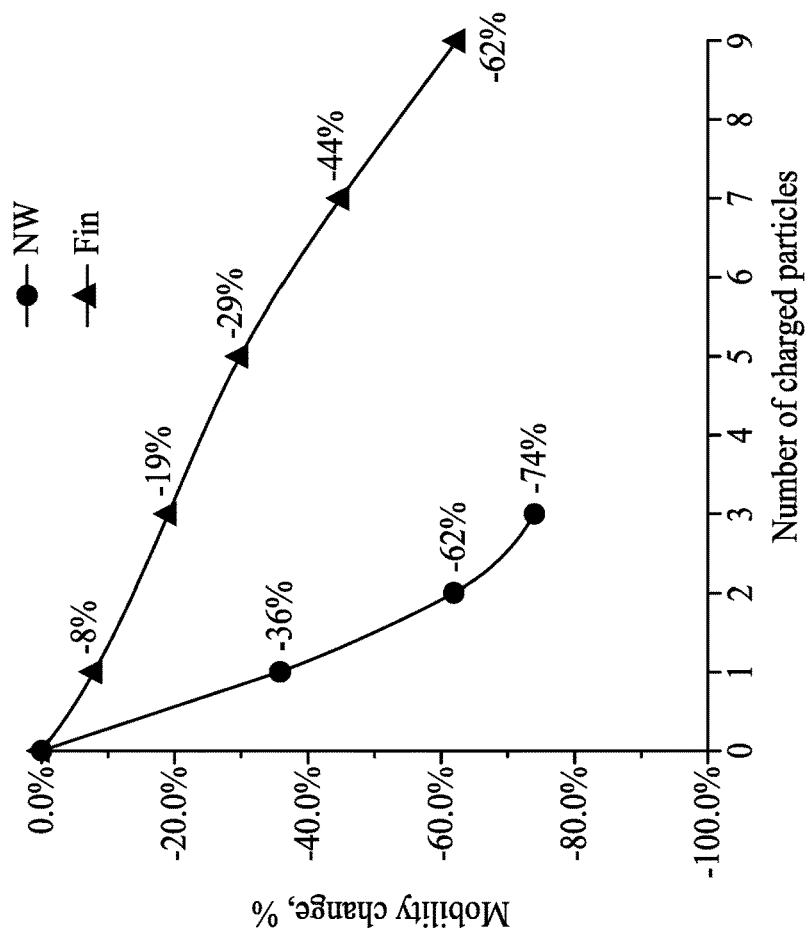
FIG. 1B is a diagram showing the effect on carrier mobility change with respect to the number of charged particles in a nanowire and in a semiconductor fin structure.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
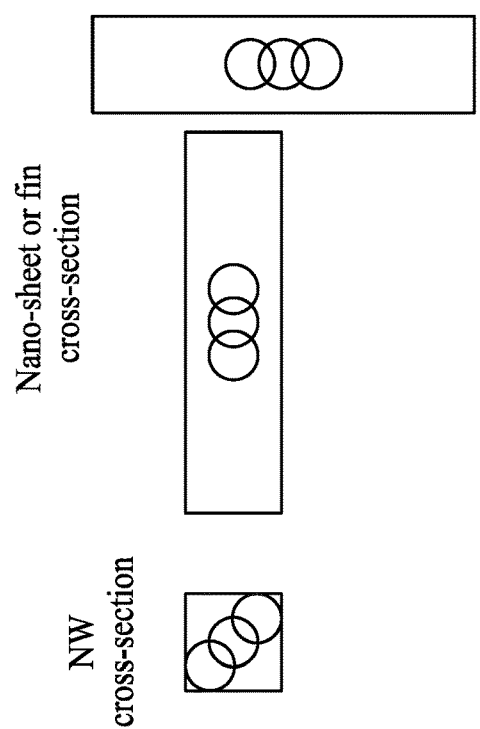
FIG. 1A is an illustration showing coulomb scattering in a nanowire and in a semiconductor fin structure.

In a FinFET device, dopants or defects in channel region could reduce the mobility of the minority carriers to a degree less extensive than dopants or defects in the channel region of a Gate-all-around device since the physical channel of the FinFET device is larger than the Gate-all-around counterpart, as shown in FIG. 1A, similar amount of dopants or defects would have a greater impact on carrier mobility to the Gate-all-around device. As shown FIG. 1B, simulation results shows that a number of 3 charged particles in the channel region of a Gate-all-around device would reduce the carrier mobility by 74% whereas the same number of charged particles in the channel region of a FinFET device would reduce the carrier mobility by 19%. In other words, as advancing from FinFET device to Gate-all-around device, extra care shall be taken when designing the structure at the doped region in proximity to the channel region in order to prevent the undesired diffusion of the dopants or defects into the channel region.

Gate-all-around MOSFET structure features a 3D gate area with multiple nanowire channels. An anti-punch through (APT) implantation is applied to alleviate the channel punch-through leakage current and reverse bias p-n junction leakage in a Gate-all-around MOSFET structure. However, APT implantation is applied in a region immediately next to channel region; therefore, structural integrity of the channel region is susceptible to be damaged. In addition, N/P well implant is also a source of defects entering the channel region due to its proximity to the bottom nanowire channel. Instead of having the APT region and the N/P well region directly in close proximity or in direct contact with the channel region, present disclosure provides a barrier layer buffering the dopant diffusion originating from the APT and/or the N/P well regions.

The barrier layer buffering the dopant diffusion originating from the APT and/or the N/P well regions, for example, can be disposed between a top surface of the semiconductor substrate and the bottom of the nanowire channels. In some embodiments, the barrier layer can be composed of crystalline materials. In some embodiments, the barrier layer can be composed of materials identical to or different from the nanowire channels. In some embodiments, the barrier layer may or may not be removed, or may be partially removed, in the final product, depending on the material selection of the barrier layer.

In the art of gate-all-around MOSFET, several material systems including Group III and Group IV materials are currently known and shall be encompassed within the contemplated scope of present disclosure. For example, on a silicon substrate, Si nanowire channel for NMOS and SiGe nanowire channel for PMOS are normally adopted. On a GaAs substrate, GaAs nanowire channel for NMOS and InGaAs nanowire channel for PMOS are normally adopted. On a Ge/GaAs substrate, Ge nanowire channel for NMOS and GaAs nanowire channel for PMOS are normally adopted. For brevity purpose, present disclosure provides illustration and detailed description in Si nanowire and SiGe nanowire material system only. The same inventive concept can be applied on different semiconductor material systems are addressed.

Figure 2A:
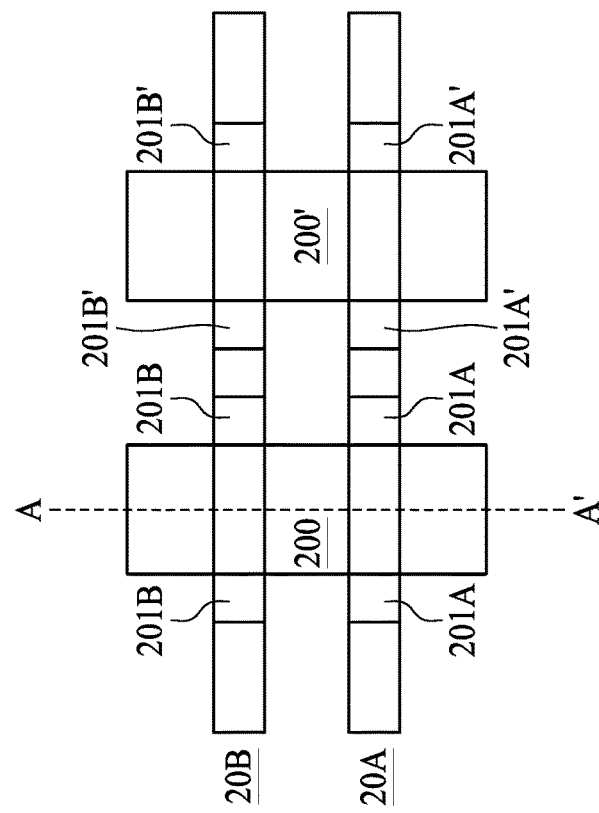
FIG. 2A and FIG. 2B are top views showing a non-planar semiconductor structure and dissection lines over different locations, in accordance with some embodiments of the present disclosure.
Figure 2B:
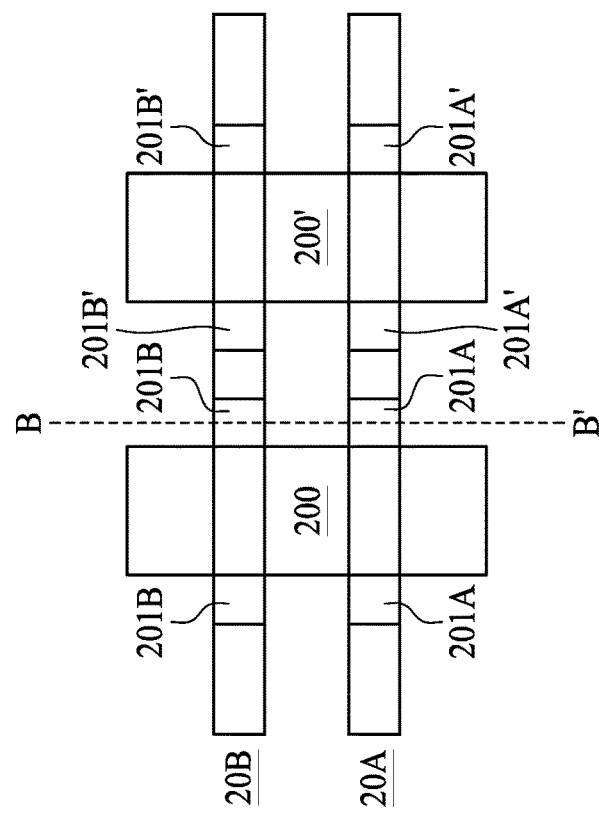

Referring to FIG. 2A and FIG. 2B, FIG. 2A and FIG. 2B are top views showing a non-planar semiconductor structure and dissection lines over different locations, in accordance with some embodiments of the present disclosure. In FIG. 2A, active regions 20A and 20B are illustrated in two parallel strips. In the embodiments describing a Gate-all-around MOSFET structure, the active region includes the doped regions of a patterned semiconductor substrate, as well as the nanowire channel over the patterned semiconductor substrate. In the following disclosure, active region 20A may include a portion of a PMOS transistor structure and active region 20B may include a portion of an NMOS transistor structure. In the present disclosure, numeral label 20A can be commonly referred to the active region having a PMOS transistor structure, and numeral label 20B can be commonly referred to the active region having an NMOS transistor structure. Two gates 200 and 200' are orthogonally disposed over the active regions 20A and 20B, abutted by the source/drain regions 201A, 201B at the gate 200 and source/drain regions 201A', 201B' at the gate 200'. The dissection lines AA' passes through the gate 200 along a longitudinal direction thereof, thereby showing a cross section of the gate 200 (omitted for simplicity) and the underlying active regions 20A and 20B in subsequent FIG. 3 and FIG. 4. Similarly, in FIG. 2B, active regions 20A and 20B are illustrated in two parallel strips. In the following disclosure, active region 20A may be a PMOS transistor structure and active region 20B may be an NMOS transistor structure. Two gates 200 and 200' are orthogonally disposed over the active regions 20A and 20B, abutted by the source/drain regions 201A, 201B at the gate 200 and source/drain regions 201A', 201B' at the gate 200'. The dissection lines BB' passes through the source/drain regions 201A, 201B, thereby showing a cross section of the source/drain region 201A, 201B and the underlying active regions 20A and 20B in subsequent FIG. 5 and FIG. 6.

Figure 3:
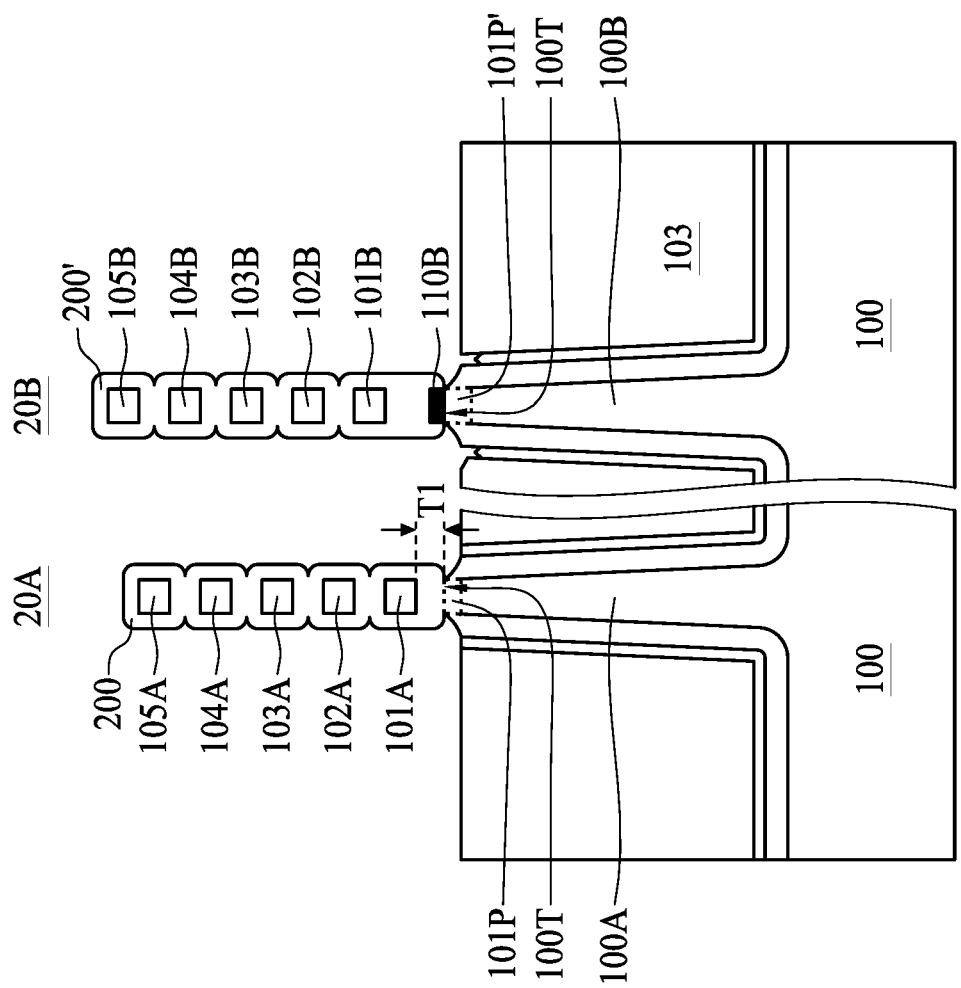
FIG. 3 is a cross sectional view of a semiconductor structure dissecting along dissection lines AA' of FIG. 2A, in accordance with some embodiments of the present disclosure.

Referring to FIG. 3, FIG. 3 is a cross sectional view of a semiconductor structure 30 dissecting along dissection lines AA' of FIG. 2A, in accordance with some embodiments of the present disclosure. For the purpose of simplicity, a portion of the gate 200 over all the nanowires is omitted in FIG. 3. The semiconductor structure 30 includes a PMOS 20A and an NMOS 20B. In some embodiments, the PMOS 20A may or may not be disposed adjacent to the NMOS 20B.

The semiconductor structure 30 includes a substrate 100 patterned in to at least two semiconductor fins 100A, 100B. In some embodiments, the substrate 100 includes silicon, and the substrate 100 is formed according to a FinFET arrangement including one or more silicon fins separated by isolation structures 103, such as shallow trench isolation (STI). For example, a first fin 100A and a second fin 100B are formed from on the substrate 100 and having a top surface 100T at each of the fins 100A, 100B. An anti-punch through region (APT) 101P is formed in proximity to the top surface 100T in the PMOS 20A by an APT implantation with an n-type dopant, such as phosphorous. An APT 101P' is formed in proximity to the top surface 100T in the NMOS 20B by another APT implantation with a p-type dopant, such as boron.

Still referring to FIG. 3, the PMOS 20A further includes a plurality of SiGe nanowires 101A, 102A, 103A, 104A, 105A, along a longitudinal direction of the first fin 100A, connecting the source/drain 201A (not shown in FIG. 3) at both ends of the SiGe nanowires 101A, 102A, 103A, 104A, 105A. Among all the SiGe nanowires, 101A is called a bottom SiGe nanowire, which is the closest nanowire to the top surface 100T of the semiconductor fin 100A. In some embodiments, a distance between the top surface 100T and a bottom of the bottom SiGe nanowire 101A is approximately from about 1 nm to about 10 nm. In some embodiments, the gate 200 is filled between adjacent SiGe nanowires 101A, 102A, 103A, 104A, 105A, as well as between the top surface 100T and the bottom SiGe nanowire 101A.

As shown in FIG. 3, no barrier layer is shown in the PMOS 20A because the barrier layer was removed or partially removed during a nanowire releasing operation at the channel, as described later in FIG. 18A. The APT region 101P may have an n-type dopant concentration of about $5E18/cm^3$. Due to the effective buffering of the barrier layer described herein, the n-type dopant concentration at a bottom portion of the bottom SiGe nanowire 101A may be lower than $1E18/cm^3$.

Similarly, the NMOS 20B further includes a plurality of Si nanowires 101B, 102B, 103B, 104B, 105B, along a longitudinal direction of the second fin 100B, connecting the source/drain 201B (not shown in FIG. 3) at both ends of the Si nanowires 101B, 102B, 103B, 104B, 105B. Among all the Si nanowires, 101B is called a bottom Si nanowire, which is the closest nanowire to the top surface 100T of the semiconductor fin 100B. In some embodiments, a distance between the top surface 100T and a bottom of the bottom Si nanowire 101B is greater than the distance between the top surface 100T and a bottom of the bottom SiGe nanowire 101A. In some embodiments, the gate 200 is filled between adjacent Si nanowires 101B, 102B, 103B, 104B, 105B, as well as between the top surface 100T and the bottom Si nanowire 101B.

As shown in FIG. 3, a barrier layer 110B is shown in the NMOS 20B over the APT region 101P' and below the gate 200 and the bottom Si nanowire 101B. In some embodiments, the barrier layer 110B is composed of crystalline silicon or carbon-doped crystalline silicon. The APT region 101P' may have a p-type dopant concentration of about $5E18/cm^3$. The p-type dopant concentration at a bottom portion of the bottom Si nanowire 101B may be lower than $1E18/cm^3$. In some embodiments, the p-type dopant can be boron.

Figure 4:
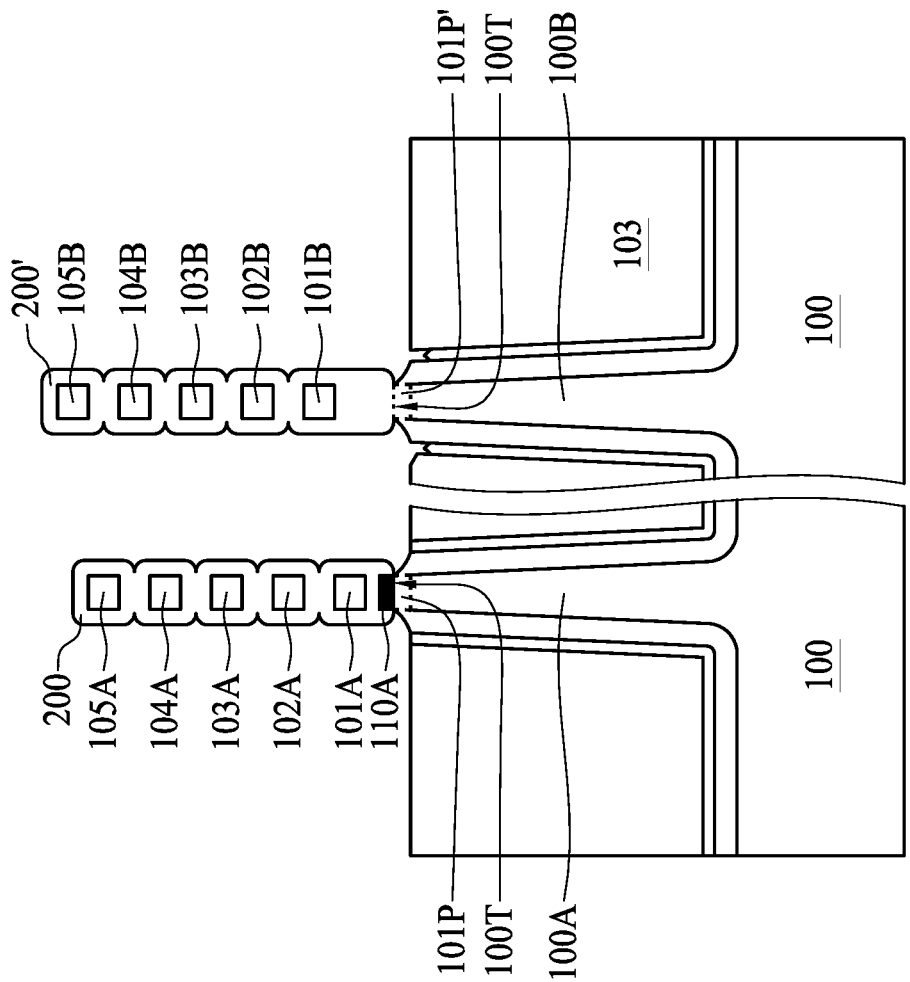
FIG. 4 is a cross sectional view of a semiconductor structure dissecting along dissection lines AA' of FIG. 2A, in accordance with some embodiments of the present disclosure.

Referring to FIG. 4, FIG. 4 is a cross sectional view of a semiconductor structure 40 dissecting along dissection lines AA' of FIG. 2A, in accordance with some embodiments of the present disclosure. For the purpose of simplicity, a portion of the gate 200 over all the nanowires is omitted in FIG. 4. The semiconductor structure 40 includes a PMOS 20A and an NMOS 20B. In some embodiments, the PMOS 20A may or may not be disposed adjacent to the NMOS 20B.

The semiconductor structure 40 includes a substrate 100 patterned in to at least two semiconductor fins 100A, 100B. In some embodiments, the substrate 100 includes silicon, and the substrate 100 is formed according to a FinFET arrangement including one or more silicon fins separated by isolation structures 103, such as shallow trench isolation (STI). For example, a first fin 100A and a second fin 100B are formed from on the substrate 100 and having a top surface 100T at each of the fins 100A, 100B. An anti-punch through region (APT) 101P is formed in proximity to the top surface 100T in the PMOS 20A by an APT implantation with an n-type dopant, such as phosphorous. An APT 101P' is formed in proximity to the top surface 100T in the NMOS 20B by another APT implantation with a p-type dopant, such as boron.

Still referring to FIG. 4, the NMOS 20B further includes a plurality of Si nanowires 101B, 102B, 103B, 104B, 105B, along a longitudinal direction of the second fin 100B, connecting the source/drain 201B (not shown in FIG. 3) at both ends of the Si nanowires 101B, 102B, 103B, 104B, 105B. Among all the Si nanowires, 101B is called a bottom Si nanowire, which is the closest nanowire to the top surface 100T of the semiconductor fin 100B. In some embodiments, a distance between the top surface 100T and a bottom of the bottom Si nanowire 101B is approximately greater than the distance between the top surface 100T of the semiconductor fin 100A and the a bottom of the bottom SiGe nanowire 101A. In some embodiments, the gate 200' is filled between adjacent Si nanowires 101B, 102B, 103B, 104B, 105B, as well as between the top surface 100T and the bottom Si nanowire 101B.

As shown in FIG. 4, no barrier layer is shown in the NMOS 20B because the barrier layer was removed or partially removed during a nanowire releasing operation at the channel, as described later in FIG. 17B. The APT region 101P' may have a p-type dopant concentration of about $5E18/cm^3$. The p-type dopant concentration at a bottom portion of the bottom Si nanowire 101B may be lower than $1E18/cm^3$.

Similarly, the PMOS 20A further includes a plurality of SiGe nanowires 101A, 102A, 103A, 104A, 105A, along a longitudinal direction of the first fin 100A, connecting the source/drain 201A (not shown in FIG. 3) at both ends of the SiGe nanowires 101A, 102A, 103A, 104A, 105A. Among all the SiGe nanowires, 101A is called a bottom SiGe nanowire, which is the closest nanowire to the top surface 100T of the semiconductor fin 100A. In some embodiments, a distance between the top surface 100T and a bottom of the bottom SiGe nanowire 101A is in a range of from about 1 nm to about 10 nm. In some embodiments, the gate 200 is filled between adjacent SiGe nanowires 101A, 102A, 103A, 104A, 105A, as well as between the top surface 100T and the bottom SiGe nanowire 101A.

As shown in FIG. 4, a barrier layer 110A is shown in the PMOS 20A over the APT region 101P and below the gate 200 and the bottom SiGe nanowire 101A. In some embodiments, the barrier layer 110A is composed of crystalline silicon germanium or carbon-doped crystalline silicon germanium. The APT region 101P may have an n-type dopant concentration of about $5E18/cm^3$. The n-type dopant concentration at a bottom portion of the bottom SiGe nanowire 101A may be lower than $1E18/cm^3$. In some embodiments, the n-type dopant can be phosphorous.

Figure 5:
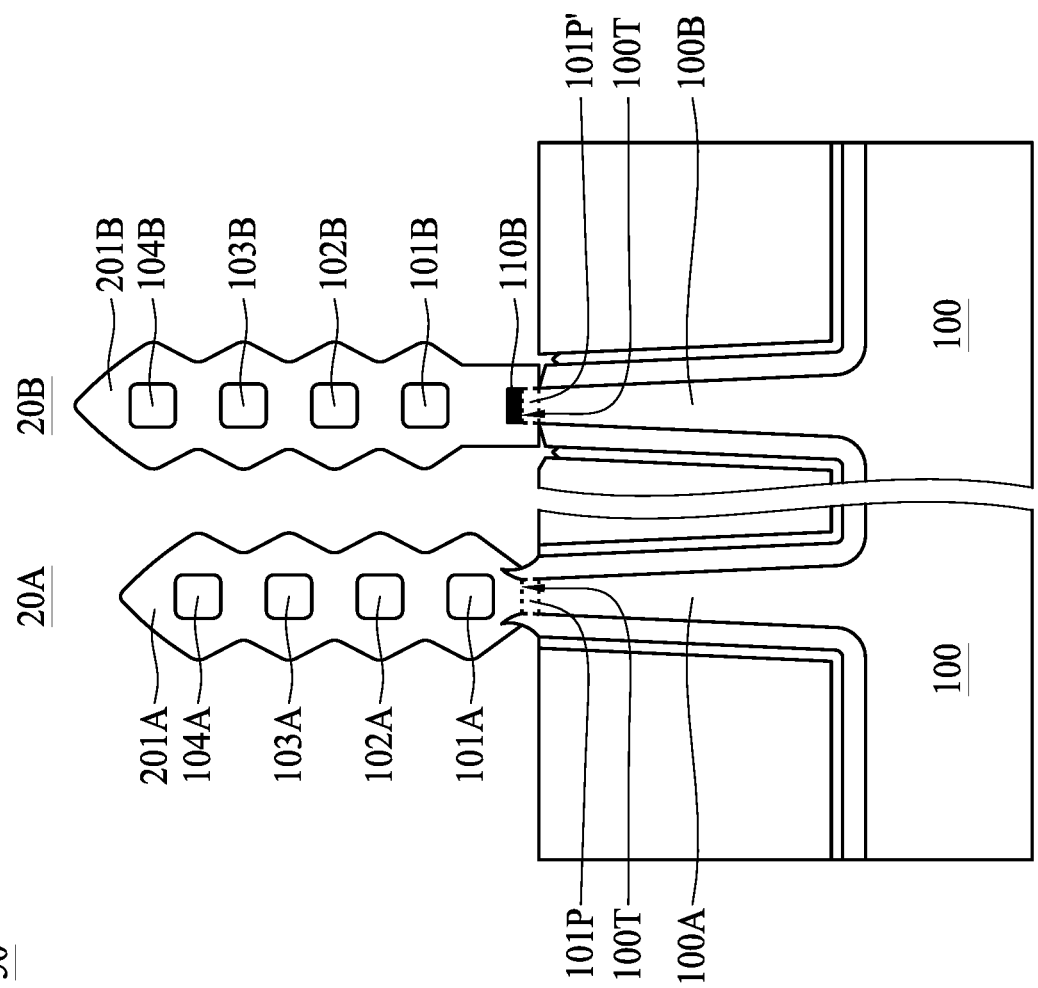
FIG. 5 is a cross sectional view of a semiconductor structure dissecting along dissection lines BB' of FIG. 2B, in accordance with some embodiments of the present disclosure.

Referring to FIG. 5, FIG. 5 is a cross sectional view of a semiconductor structure 50 dissecting along dissection lines BB' of FIG. 2B, in accordance with some embodiments of the present disclosure. The semiconductor structure 50 includes a PMOS 20A and an NMOS 20B. In some embodiments, the PMOS 20A may or may not be disposed adjacent to the NMOS 20B. Identical numeral labels in FIG. 5 and FIG. 3 refer to the same components or their equivalents and are not repeated here for brevity. In FIG. 5, source/drain 201A of PMOS 20A is surrounding SiGe nanowires 101A, 102A, 103A, 104A, whereas source/drain 201B of NMOS 20B is surrounding Si nanowires 101B, 102B, 103B, 104B and the barrier layer 110B. As shown in FIG. 5, a contour of the source/drain 201A or 201B shows faceted sidewall according to each nanowire. However, in other embodiments, the source/drain 201A or 201B may possess a cladding structure, which vertical sidewalls at both ends of the stacked nanowires can be inspected. In still other embodiments, the source/drain 201A or 201B possesses a recess structure encraving from a top of the semiconductor fin 100A/100B. Alternatively speaking, a bottom of the source/drain 201A or 201B may be lower than the top surface 100T of the semiconductor substrate 100. In some embodiments, the barrier layer 110B in NMOS 20B is composed of crystalline silicon or carbon-doped crystalline silicon. No barrier layer is shown in the PMOS 20A because the barrier layer was removed or partially removed during a nanowire releasing operation at the source/drain 201A.

Figure 6:
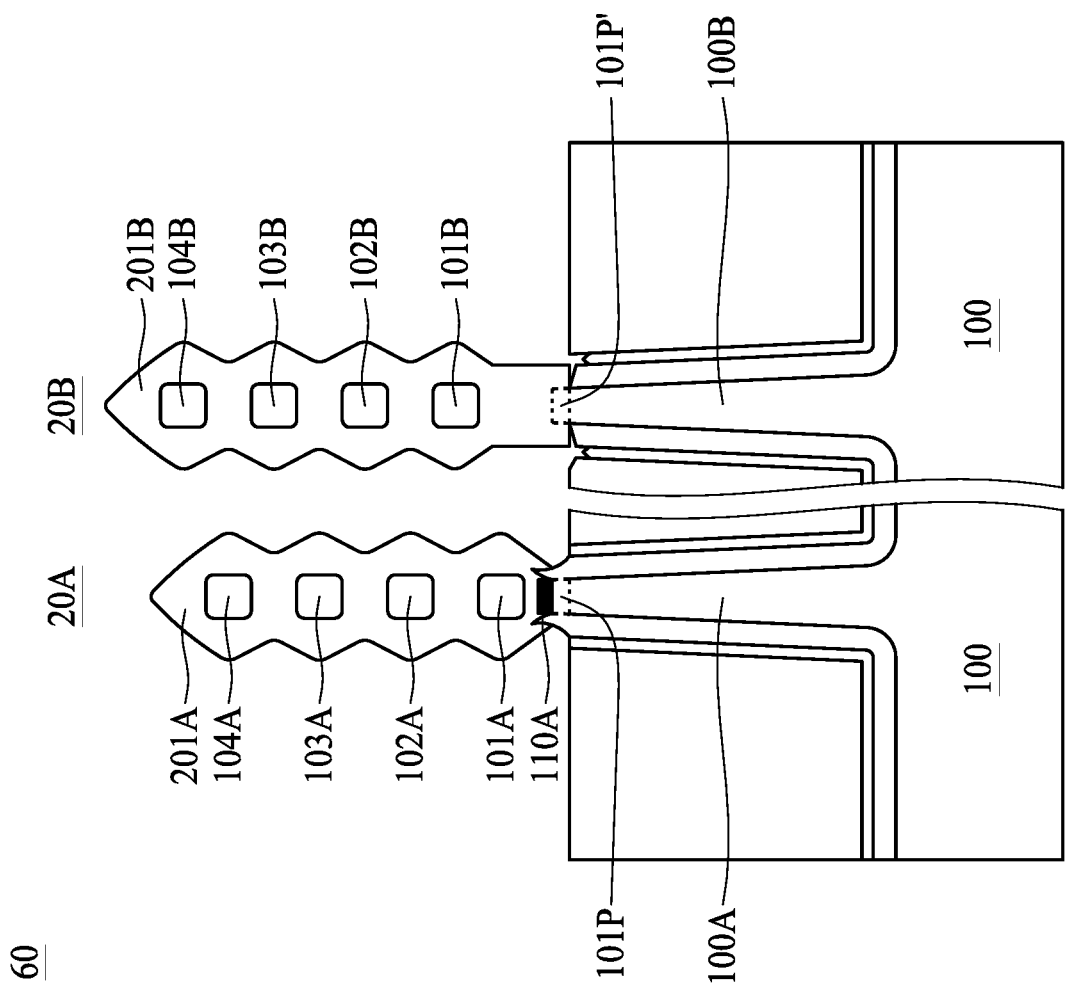
FIG. 6 is a cross sectional view of a semiconductor structure dissecting along dissection lines BB' of FIG. 2B, in accordance with some embodiments of the present disclosure.

Referring to FIG. 6, FIG. 6 is a cross sectional view of a semiconductor structure 60 dissecting along dissection lines BB' of FIG. 2B, in accordance with some embodiments of the present disclosure. The semiconductor structure 60 includes a PMOS 20A and an NMOS 20B. In some embodiments, the PMOS 20A may or may not be disposed adjacent to the NMOS 20B. Identical numeral labels in FIG. 6 and FIG. 4 refer to the same components or their equivalents and are not repeated here for brevity. In FIG. 6, source/drain 201A of PMOS 20A is surrounding SiGe nanowires 101A, 102A, 103A, 104A and the barrier layer 110A, whereas source/drain 201B of NMOS 20B is surrounding Si nanowires 101B, 102B, 103B, 104B. As shown in FIG. 6, a contour of the source/drain 201A or 201B shows faceted sidewall according to each nanowire. However, in other embodiments, the source/drain 201A or 201B may possess a cladding structure, which vertical sidewalls at both ends of the stacked nanowires can be inspected. In still other embodiments, the source/drain 201A or 201B possesses a recess structure encraving from a top of the semiconductor fin 100A/100B. Alternatively speaking, a bottom of the source/drain 201A or 201B may be lower than the top surface 100T of the semiconductor substrate 100. In some embodiments, the barrier layer 110A in PMOS 20A is composed of crystalline silicon germanium or carbon-doped crystalline silicon germanium. No barrier layer is shown in the NMOS 20B because the barrier layer was removed or partially removed during a nanowire releasing operation at the source/drain 201B.

Figure 7:
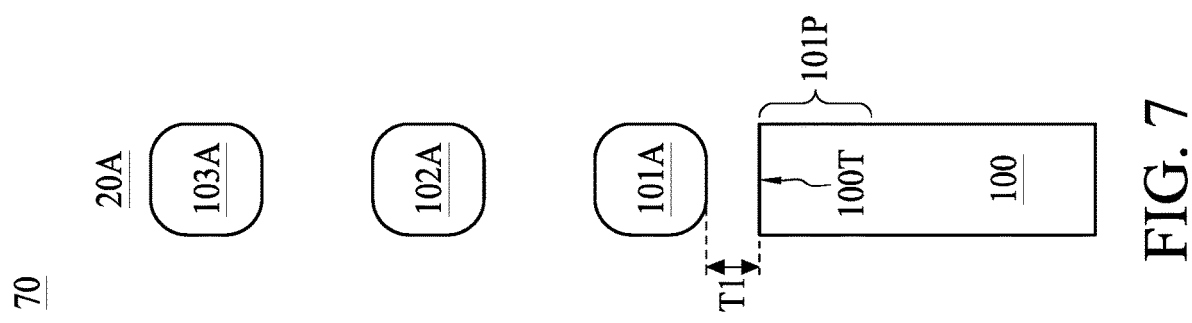
FIG. 7 is a simplified cross sectional view of a PMOS semiconductor structure dissecting along dissection lines of FIG. 2A, in accordance with some embodiments of the present disclosure.

Referring to FIG. 7, FIG. 7 is a simplified cross sectional view of a PMOS semiconductor structure 70 dissecting along dissection lines of FIG. 2A, in accordance with some embodiments of the present disclosure. The gate 200 in a PMOS semiconductor structure 70 is omitted in FIG. 7 to better show the relative positions of the top surface 100T of the semiconductor substrate and the bottom SiGe nanowire 101A. In some embodiments, a distance T1 between the bottom of the bottom SiGe nanowire 101A and the top surface 100T is at least equal to or greater than the thickness of the barrier layer (not shown in FIG. 7). In some embodiments, a thickness of the barrier layer is in a range of from about 5 nm to 10 nm. The thickness of the barrier layer shall at least be greater than the diffusion length of the n-type dopants originally in the APT region 101P. For example, an average diffusion length of an n-type dopants, phosphorous, is around 5 nm. The thickness of the barrier layer shall at least be thinner than a critical thickness that allows a complete removal of the barrier layer without damaging the underlying fins. In some embodiments, the critical thickness is around 10 nm.

Figure 8:
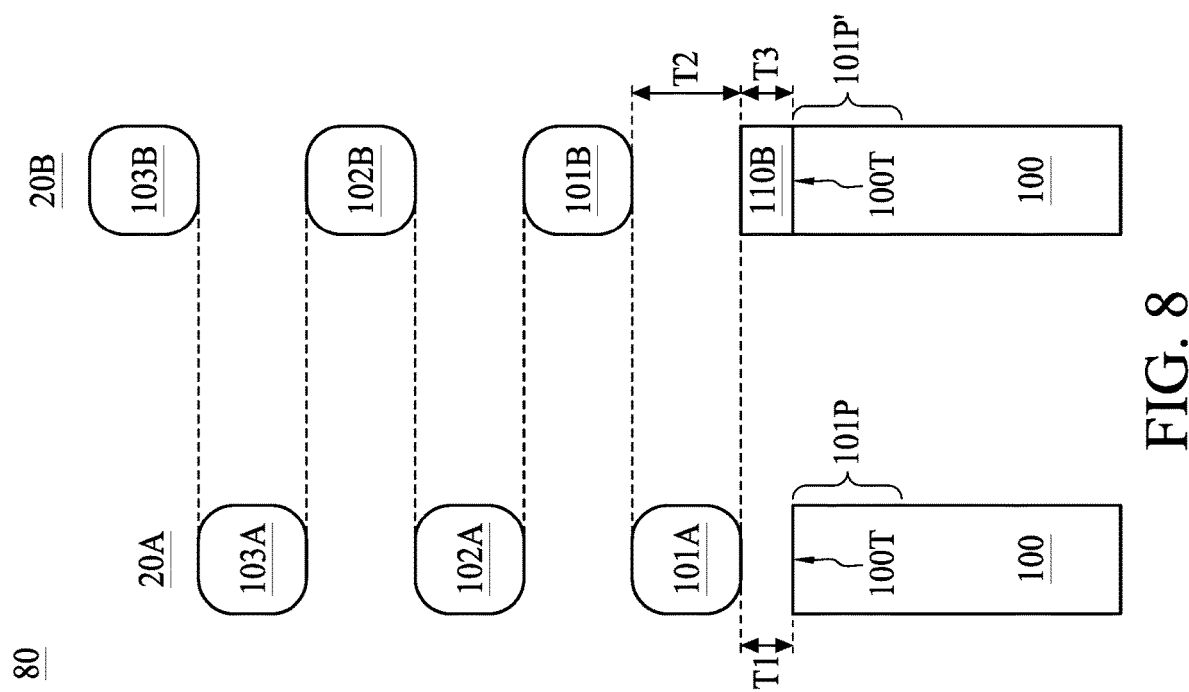
FIG. 8 is a simplified cross sectional view of a PMOS and an NMOS semiconductor structure dissecting along dissection lines of FIG. 2A, in accordance with some embodiments of the present disclosure.

FIG. 8 is a simplified cross sectional view of a PMOS and an NMOS semiconductor structure 80 dissecting along dissection lines of FIG. 2A, in accordance with some embodiments of the present disclosure. The gate 200 in PMOS and an NMOS semiconductor structure is omitted in FIG. 8 to better show the relative positions of the top surface 100T of the semiconductor substrate and the bottom SiGe nanowire 101A as well as the bottom Si nanowire 101B. In some embodiments, a distance T2 between the bottom of the bottom Si nanowire 101B and the top surface 100T is at least equal to or greater than the thickness T3 of the barrier layer 110B. For example, the distance T2 can be in a range of from about 3 nm to about 12 nm. In some embodiments, a thickness T3 of the barrier layer is in a range of from about 1 nm to 10 nm. The thickness T3 of the barrier layer shall at least be greater than the diffusion length of the p-type dopants originally in the APT region 101P'. For example, an average diffusion length of a p-type dopants, boron, is around 1 nm. The thickness of the barrier layer shall at least be thinner than a critical thickness that allows a complete removal of the barrier layer without damaging the underlying fins. In some embodiments, the critical thickness is around 10 nm.

Figure 9:
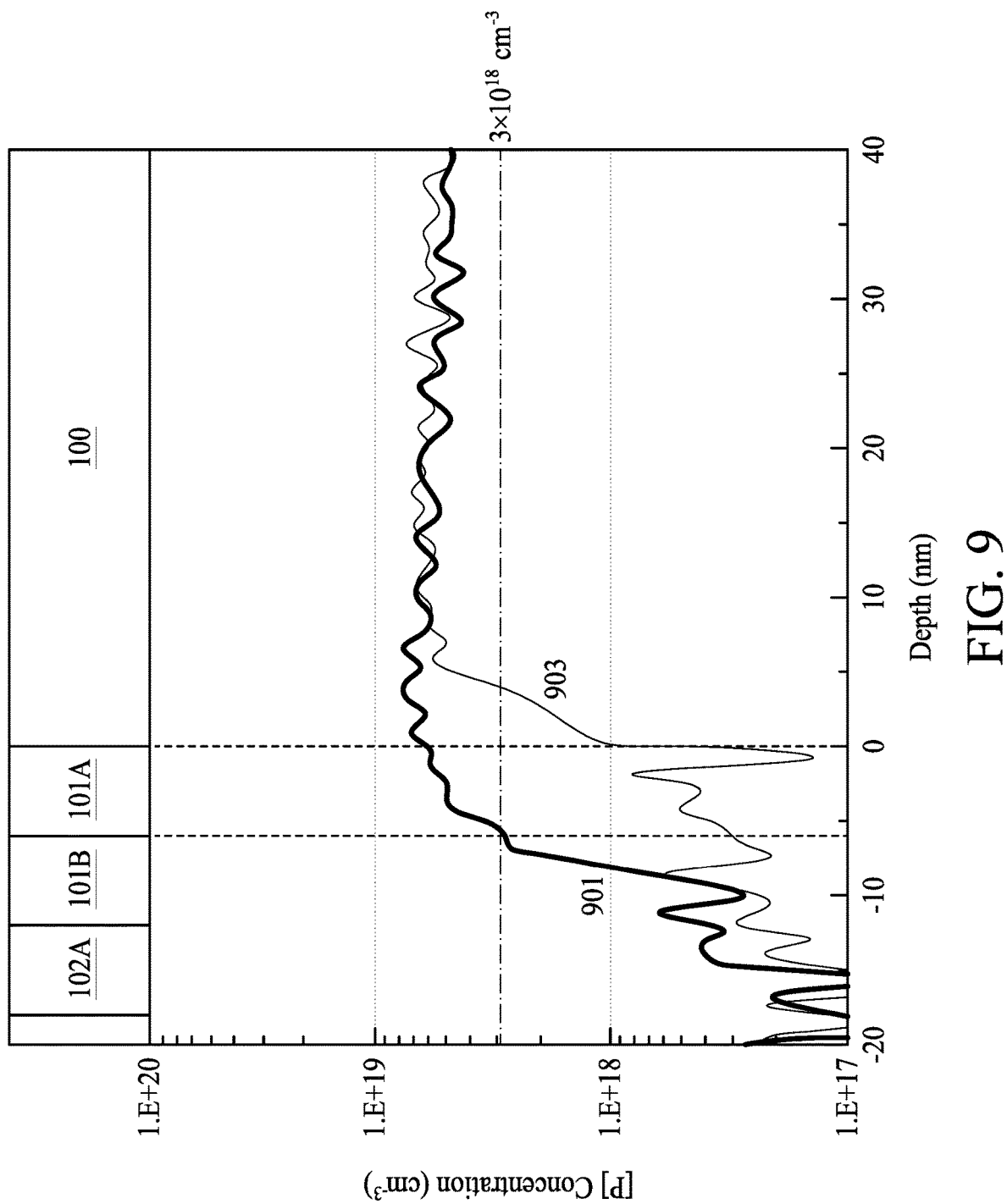
FIG. 9 is a SIMS profile showing phosphorous concentration in the first silicon germanium nanowire and in the semiconductor substrate under two scenarios, with or without barrier layer described herein, in accordance with some embodiments of the present disclosure.

Referring to FIG. 9, FIG. 9 is a SIMS profile showing phosphorous concentration in the bottom SiGe nanowire 101A and in the semiconductor substrate 100 under two scenarios. Data 901 shows the phosphorous concentration in a PMOS semiconductor structure without ever forming a barrier layer. The phosphorous concentration under the top surface 100T of the semiconductor substrate 100 is more than $5E18/cm^3$, and the phosphorous concentration in the bottom SiGe nanowire 101A is also more than $5E18/cm^3$. The comparable phosphorous concentration in the two adjacent regions shows that phosphorous diffusion without inhibition. However, Data 903 shows the phosphorous concentration in a PMOS semiconductor structure with the formation of a barrier layer during the manufacturing operations. The phosphorous concentration under the top surface 100T of the semiconductor substrate 100 is more than $5E18/cm^3$, but the phosphorous concentration in the bottom SiGe nanowire 101A is less than $1E18/cm^3$. The significant drop of phosphorous concentration in the two adjacent regions shows that phosphorous diffusion with inhibition, that is, by the hindrance of the barrier layer described herein.

Figure 10:
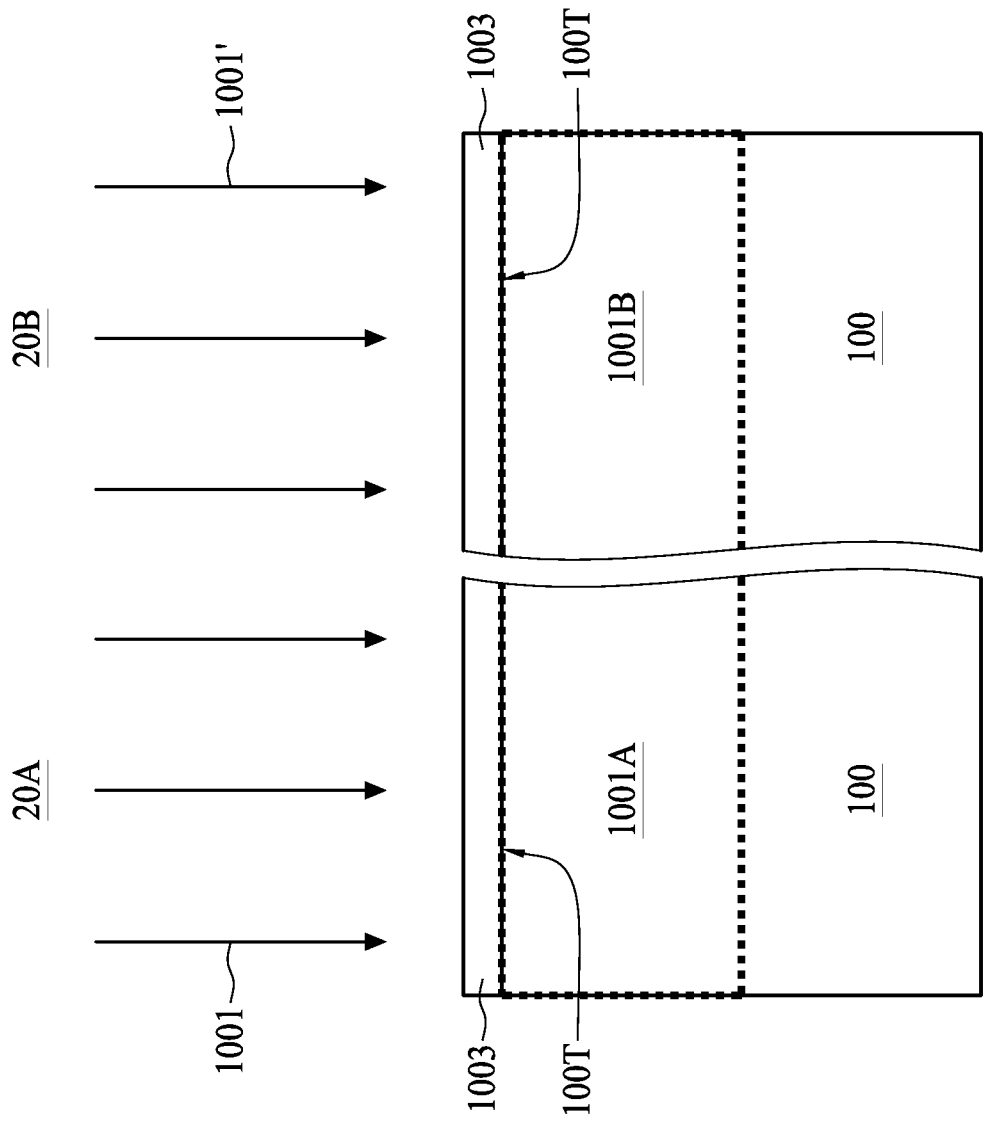
FIG. 10 to FIG. 16, FIG. 17A, FIG. 17B, FIG. 18A, FIG. 18B, FIG. 19, and FIG. 20 are cross sectional views showing intermediate operations in manufacturing a semiconductor structure, in accordance with some embodiments of the present disclosure.

FIG. 10 to FIG. 16, FIG. 17A, FIG. 17B, FIG. 18A, FIG. 18B, FIG. 19, and FIG. 20 are cross sectional views showing intermediate operations in manufacturing a semiconductor structure, in accordance with some embodiments of the present disclosure. For comprehensive purpose, left side of the substrate 100 shows the manufacturing operations of a PMOS 20A, and right side of the substrate 100 shows the manufacturing operations of an NMOS 20B. In FIG. 10, a sacrificial layer 1003 is formed over a top surface 100T of a substrate 100. In some embodiments, the sacrificial layer 1003 can be an oxide or a nitride deposited by CVD, PVD, or other suitable methods. In PMOS 20A, a first implantation operation 1001 is performed to form an n-type well 1001A extending downward from the top surface 100T. In some embodiments, the high energy dopants of the first implantation penetrate the sacrificial layer 1003 and enter into the substrate 100. Similarly, in NMOS 20B, a second implantation operation 1001' is performed to form a p-type well 1001B extending downward from the top surface 100T. Masking or photo resist patterning was conducted between the first implantation operation and the second implantation operation to form the n-type well 1001A and the p-type well 1001B, respectively, and is omitted here for simplicity. In addition, forming the p-type well 1001B does not necessarily have to be the operation immediately subsequent to forming the n-type well 1001A. In some embodiments, operations for manufacturing PMOS 20A can be performed before operations for manufacturing NMOS 20B. In some embodiments, operations for manufacturing PMOS 20A can be performed in turns with operations for manufacturing NMOS 20B.

Figure 11:
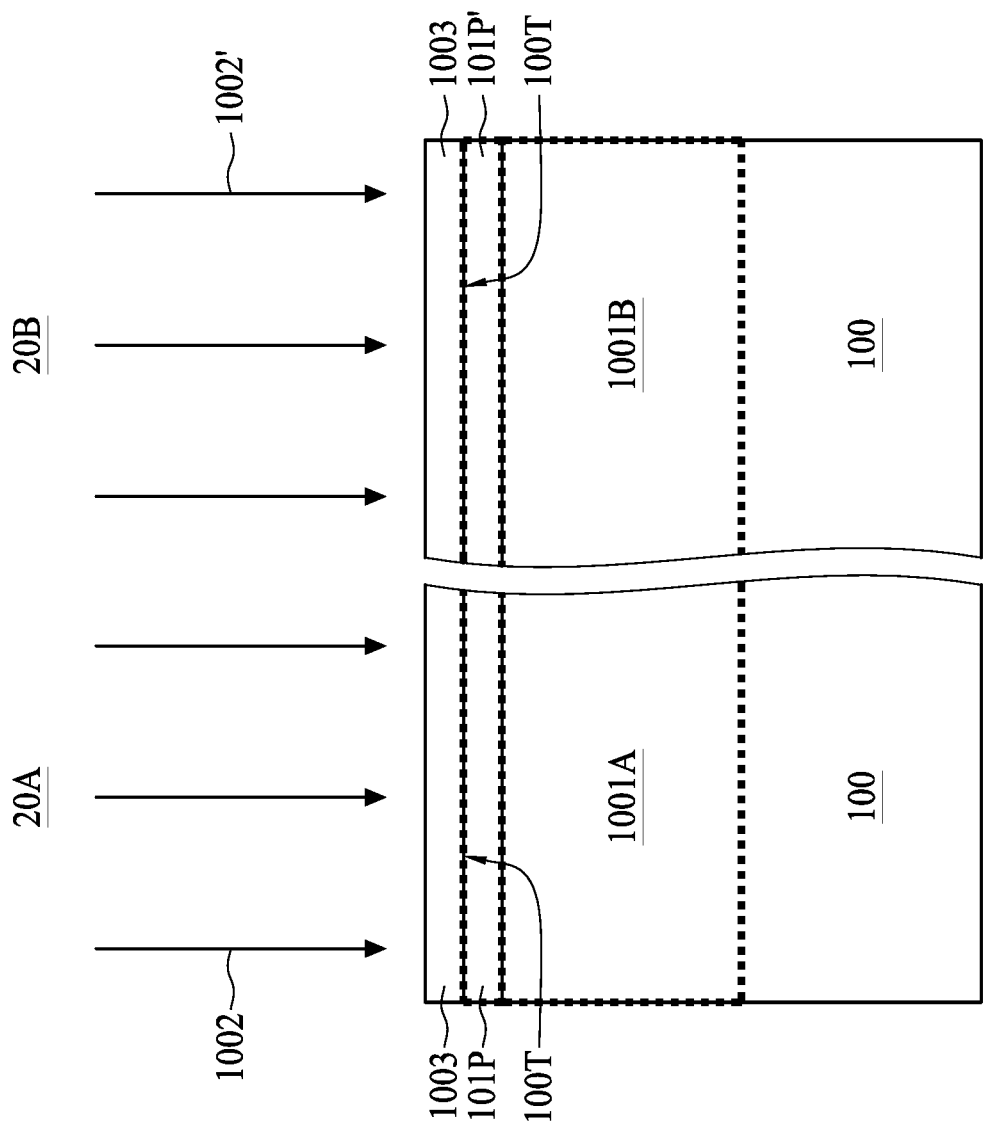
Figure 12:
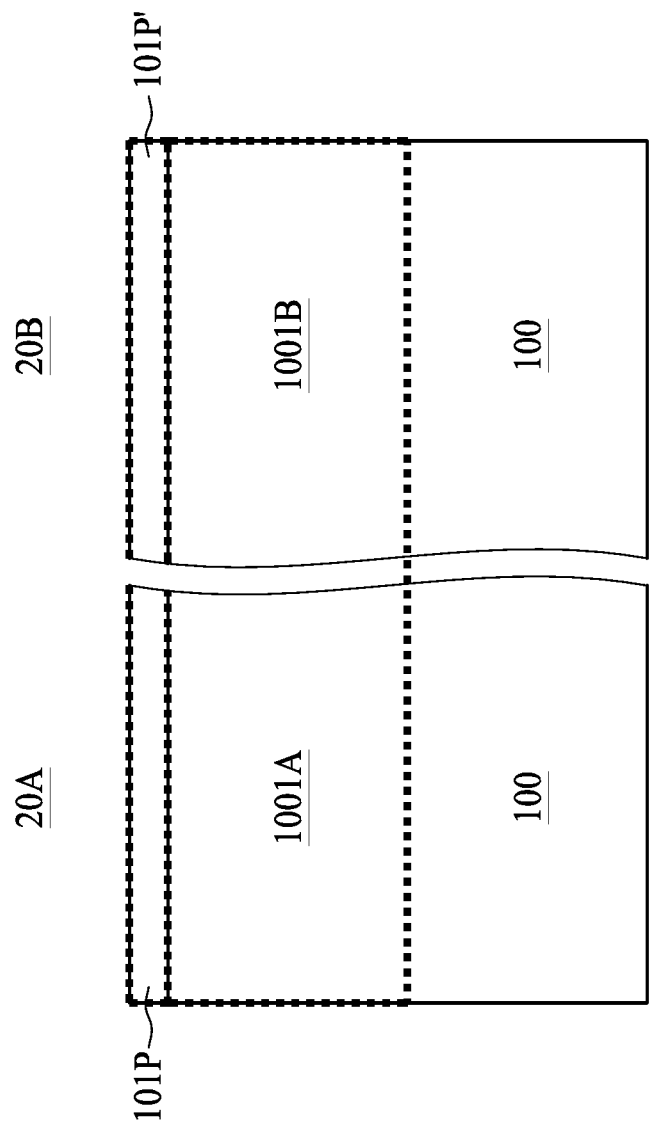

In FIG. 11, a first anti-punch through (APT) implantation operation 1002 is performed to provide n-type dopants, for instance, phosphorous or arsenic, into a first APT region 101P in the PMOS 20A. The first APT region 101P is shallower than the n-type well 1001A and is in proximity to the top surface 100T. A second anti-punch through (APT) implantation operation 1002' is performed to provide p-type dopants, for instance, boron, into a second APT region 101P' in the NMOS 20B. The second APT region 101P' is shallower than the p-type well 1001B and is in proximity to the top surface 100T. The first APT region 101P and the second APT region 101P' are both underlying and abutting the sacrificial layer 1003. In FIG. 12, the sacrificial layer 1003 is removed from the top surface 100T of semiconductor substrate 100 in the PMOS 20A and NMOS 20B, by oxide or nitride stripping operations.

Figure 13:
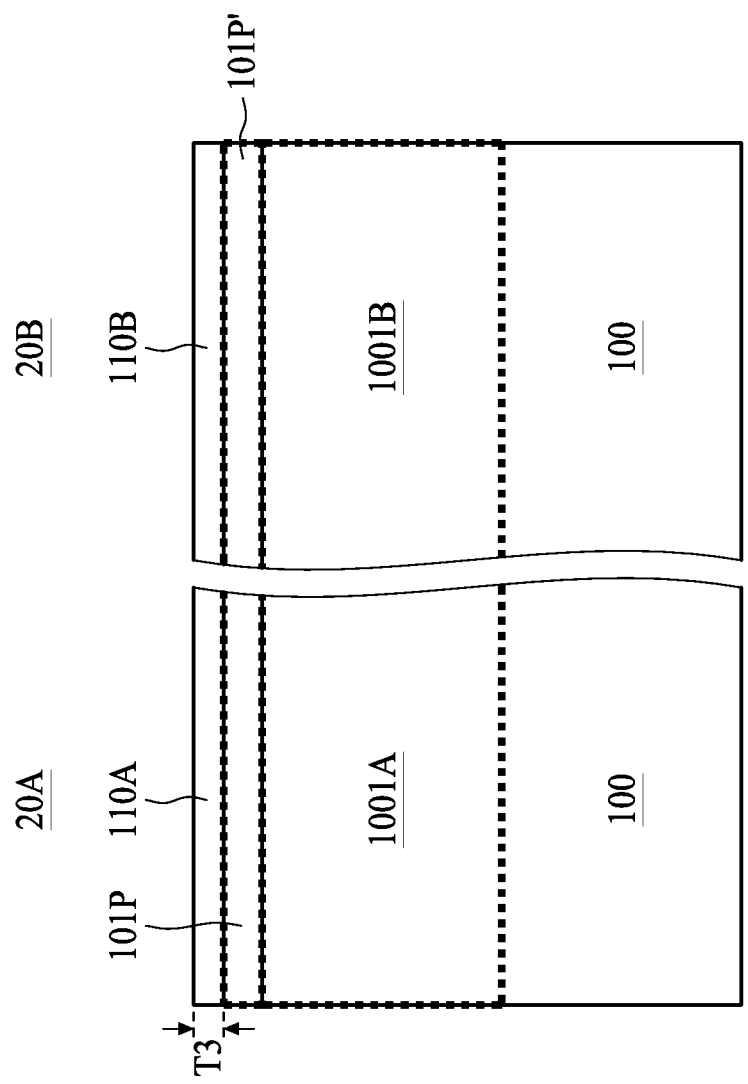

In FIG. 13, a barrier layer 110A, 110B is deposited over the top surface 100T, from which the sacrificial layer 1003 was previously removed. In some embodiments, the barrier layer 110A, 110B is in direct contact with the top surface 100T. The barrier layer 110A is designated to be the portion in the PMOS 20A and the barrier layer 110B is designated to be the portion in the NMOS 20B. In some embodiments, the barrier layer 110A, 110B is formed by a single deposition operation and is composed of the same material. Alternatively stated, barrier layer 110A and barrier layer 110B are formed simultaneously over the top surface 100T. In some embodiments, the barrier layer 110A, 110B is a crystalline layer because the subsequently overlaid materials is crystalline materials, which is preferred to be obtained with satisfactory crystallinity when the underlying template being also crystalline structure. In this connection, if a Si/SiGe stack is to be formed over the barrier layer 110A, 110B. The barrier layer 110A, 110B can be a crystalline silicon layer or a crystalline silicon germanium layer. In other embodiments, in order to reduce the degree of dopant diffusion, the barrier layer 110A, 110B can be carbon-doped, for example, a carbon-doped crystalline silicon layer or a carbon-doped crystalline silicon germanium layer. In some embodiments, a thickness T3 of the barrier layer 110A, 110B can be in a range of from about 1 nm to about 10 nm in consideration of factors such as corresponding dopant diffusion length and the etching capacity. For instance, the thickness T3 of the barrier layer shall at least be greater than a diffusion length of the n-type dopants originally in the APT region 101P or the p-type dopants originally in the APT region 101P'. On the other hand, the thickness T3 of the barrier layer shall at least be thinner than a critical thickness that allows a complete removal of the barrier layer without damaging the underlying top surface 100T of the semiconductor substrate 100.

Figure 14:
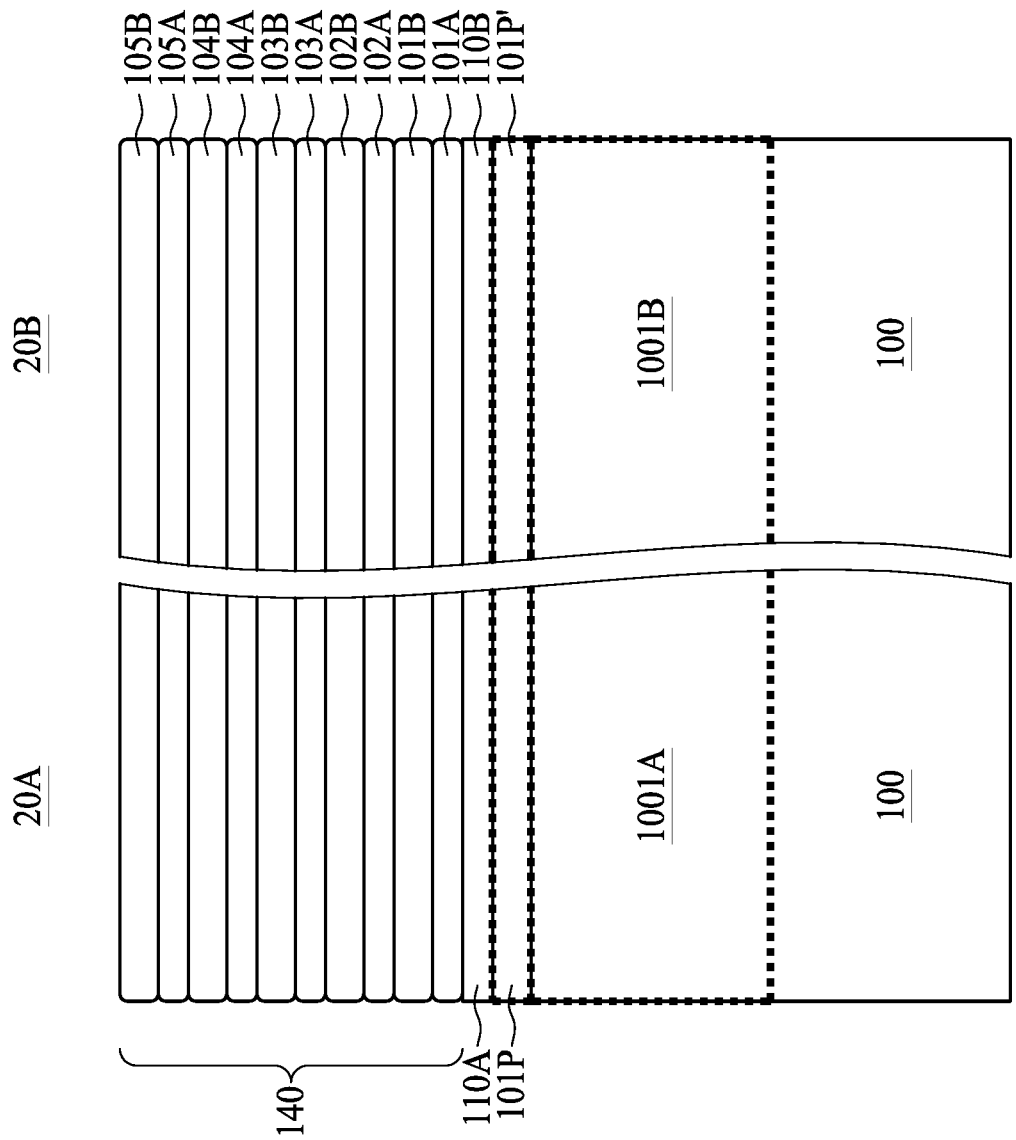
Figure 15:
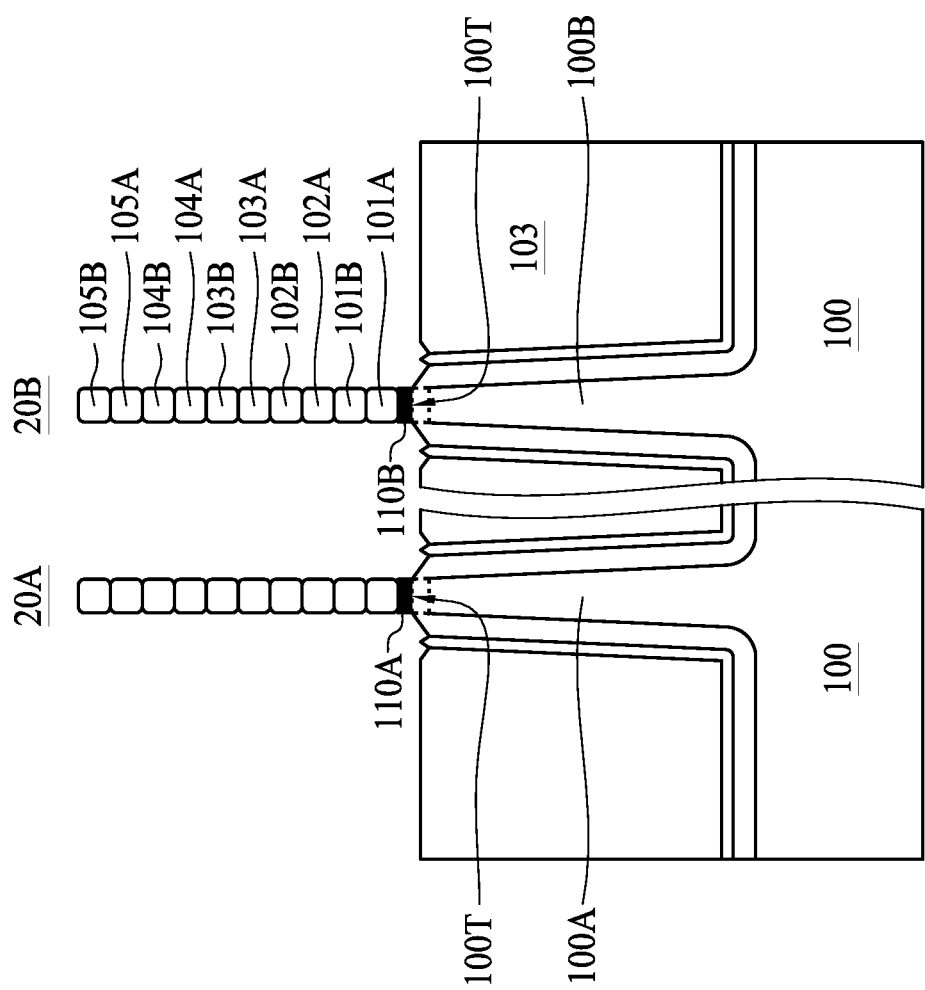

In FIG. 14, a first channel material and second channel material stack is formed over the barrier layer 110A, 110B. For example, a silicon and silicon germanium stack 140 is formed over the barrier layer 110A, 110B. For example, a first silicon and silicon germanium stack is formed over the substrate 100. The first silicon and silicon germanium stack includes one or more silicon layers and one or more silicon germanium layers. For example, the first silicon and silicon germanium stack includes a first silicon germanium layer 101A, a first silicon layer 101B, a second silicon germanium layer 102A, a second silicon layer 102B, a third silicon germanium layer 103A, a third silicon layer 103B. It is appreciated that any number of silicon layers or silicon germanium layers can be formed. In an example, a silicon germanium layer comprises between about 20% to about 75% germanium. Alternatively, at least one of the aforesaid silicon germanium layer 101A, 102A, 103A, 104A, 105A can be replaced by a pure germanium layer. The silicon and silicon germanium stack 140, the barrier layer 110A, 110B, and the substrate 100 are then patterned to form semiconductor fins 100A and 100B, separated by an STI 103, as shown in FIG. 15.

Figure 16:
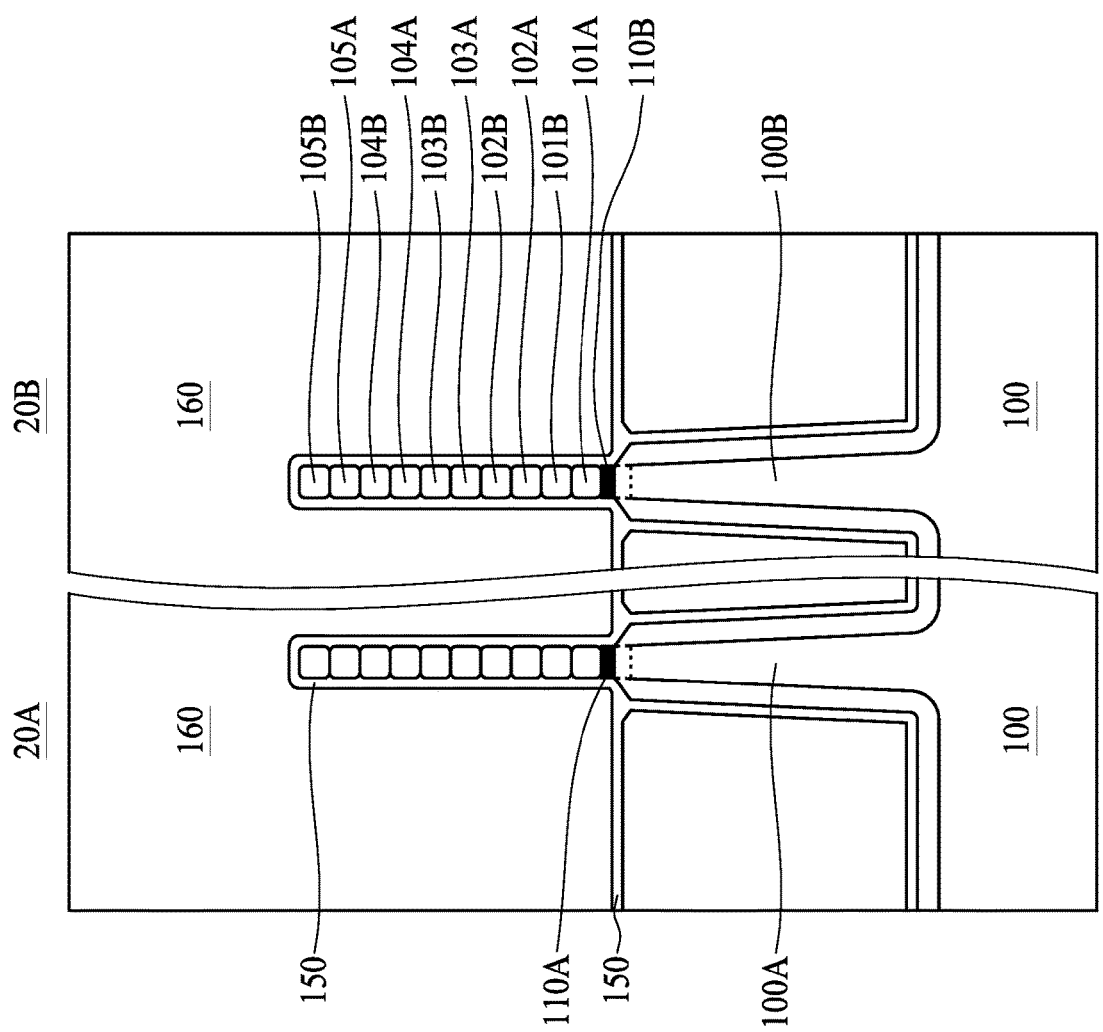

In FIG. 16, an input/output (I/O) oxide layer 150 is conformably formed over the portion of the fins 100A, 100B, the patterned silicon and silicon germanium stack 140, as well as the top surface of the STI 103. A dummy gate 160 is orthogonally formed, by a subsequent patterning operation, across the first and second fins 100A, 100B after the formation of the input/output (I/O) oxide layer 150. The dummy gate 160 is a sacrificial gate, such as a polygate, formed by a patterning technique. After the dummy gate 160 formation, dummy gate 160 is used as a hard mask for subsequent first nanowire releasing operation at the source/drain region (not shown in FIG. 16) prior to the source/drain 201A, 201B formation. Depending on the material used for the barrier layer 110A, 110B, the barrier may or may not be removed during the first nanowire releasing operation at the source/drain region. For example, if crystalline silicon or carbon-doped crystalline silicon is used as barrier layer 110A, when releasing silicon germanium nanowire in a PMOS, silicon-based material, including the barrier layer 110A, would be removed by the appropriate etchant. On the other hand, when releasing silicon nanowire in the corresponding NMOS, silicon germanium-based material would be removed by the appropriate etchant, leaving the barrier layer 110A intact after the first nanowire releasing operation. After the first nanowire releasing operation in the PMOS and the corresponding NMOS, a source/drain 201A, 201B is subsequently formed to be at both ends of the released nanowires.

Figure 17A:
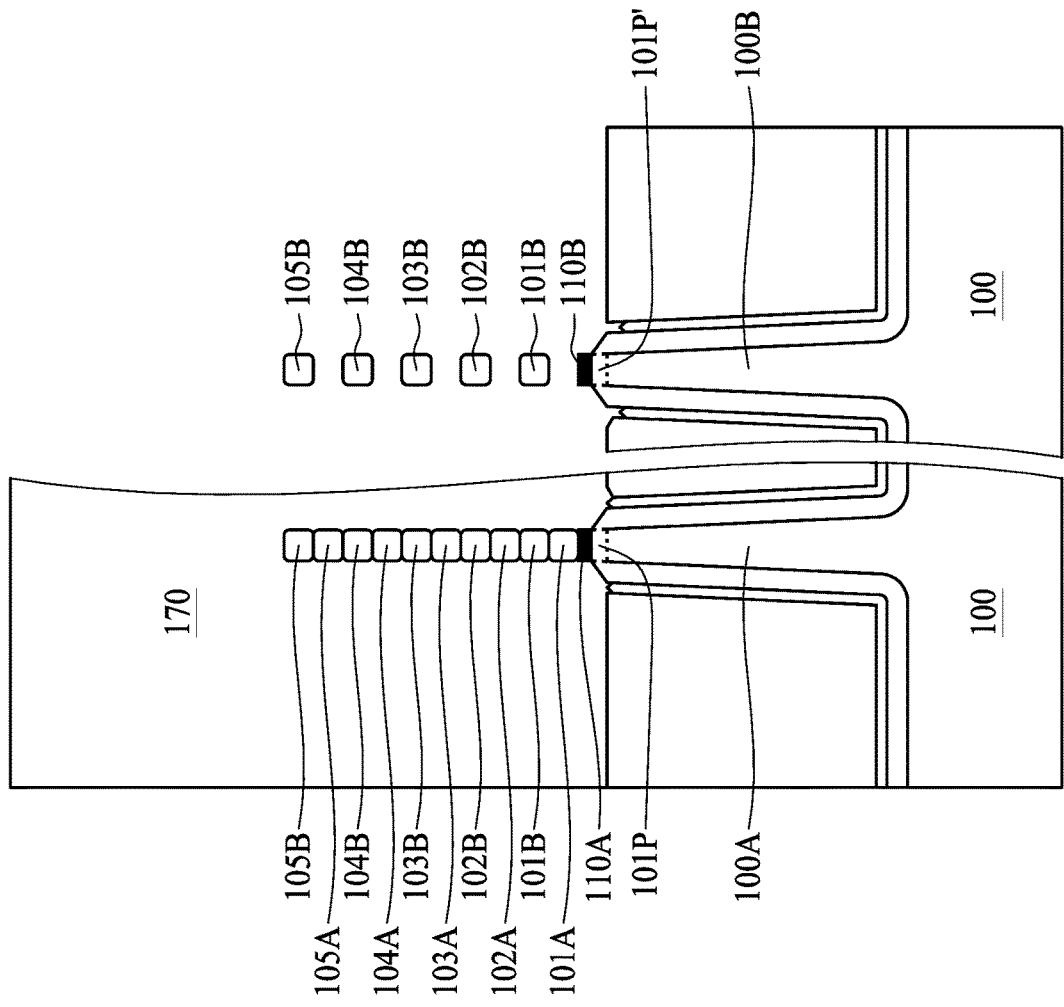
Figure 18A:
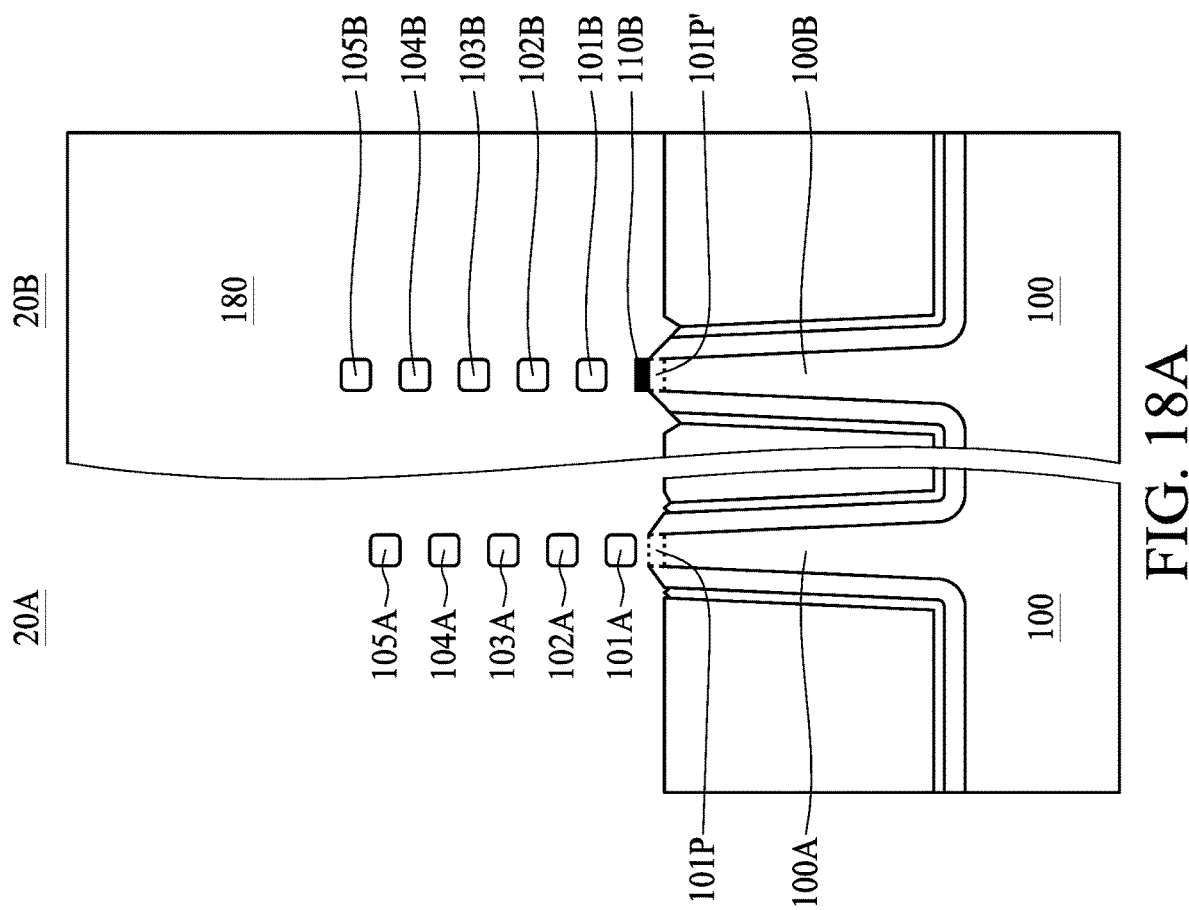

FIG. 17A and FIG. 18A show a second nanowire releasing operation at the channel region in PMOS 20A and NMOS 20B when silicon or carbon-doped silicon is used as the barrier layer 110A, 110B. Comparing to the first nanowire releasing operation, the second nanowire releasing operation is conducted at the channel region, which originally covered by the dummy gate 160, after a dummy gate removal operation, whereas the first nanowire releasing operation is conducted at the source/drain 201A, 201B utilizing the dummy gate 160 as a hard mask. In FIG. 17A, hard mask 170 is disposed over the PMOS 20A and exposing the NMOS 20B to a silicon nanowire releasing operation. As previously discussed, because the barrier layer 110B is composed of silicon or carbon-doped silicon, the barrier layer 110B is retained after the silicon nanowire releasing operation because the etchant utilized to release the Si nanowires 101B, 102B, 103B, 104B, 105B possesses lower selectivity on silicon-based material and greater selectivity on non-silicon-based material, for example, silicon germanium-based materials. Similarly, in FIG. 18A, hard mask 180 is disposed over the NMOS 20B and exposing the PMOS 20A to a silicon germanium nanowire releasing operation. As previously discussed, because the barrier layer 110A is also composed of silicon or carbon-doped silicon, the barrier layer 110A is removed after the silicon germanium nanowire releasing operation because the etchant utilized to release the SiGe nanowires 101A, 102A, 103A, 104A, 105A possesses lower selectivity on silicon germanium-based material and greater selectivity on non-silicon germanium-based material, for example, silicon-based materials.

Figure 17B:
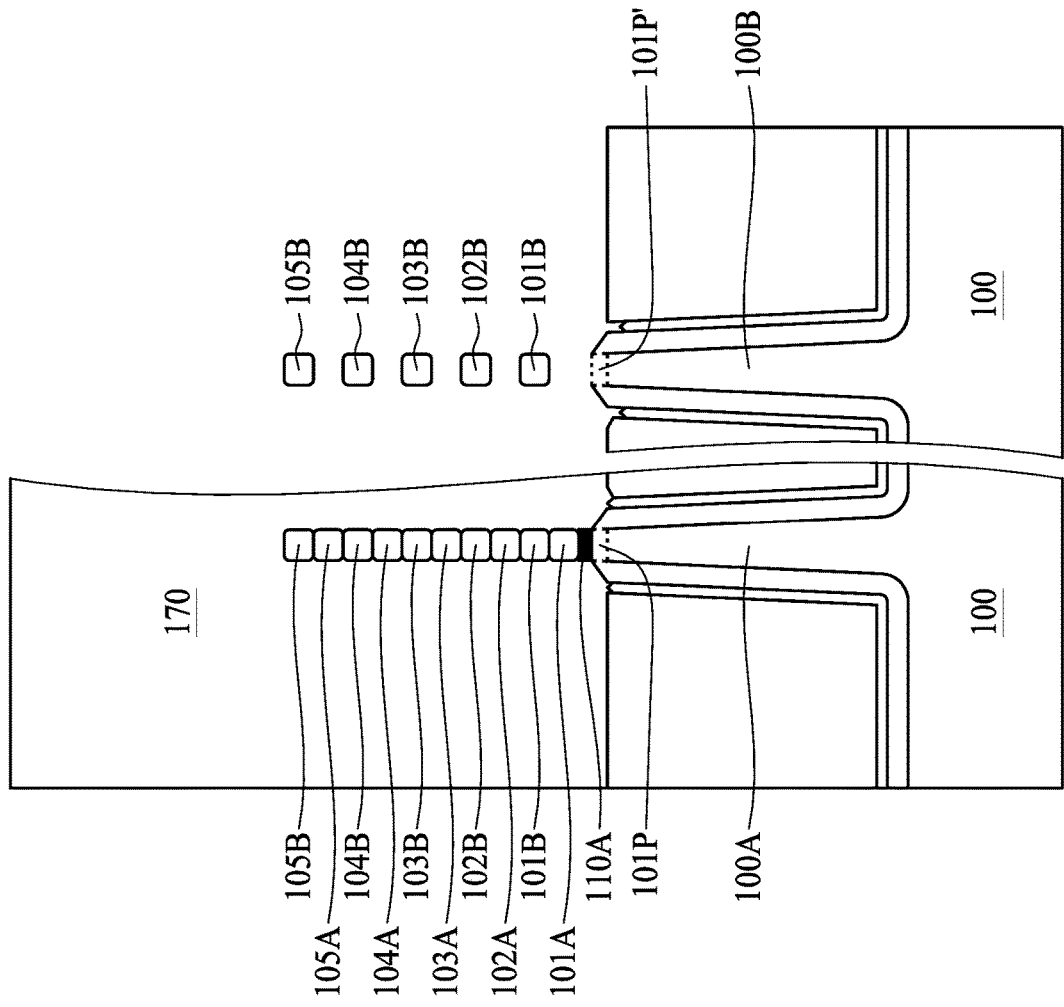
Figure 18B:
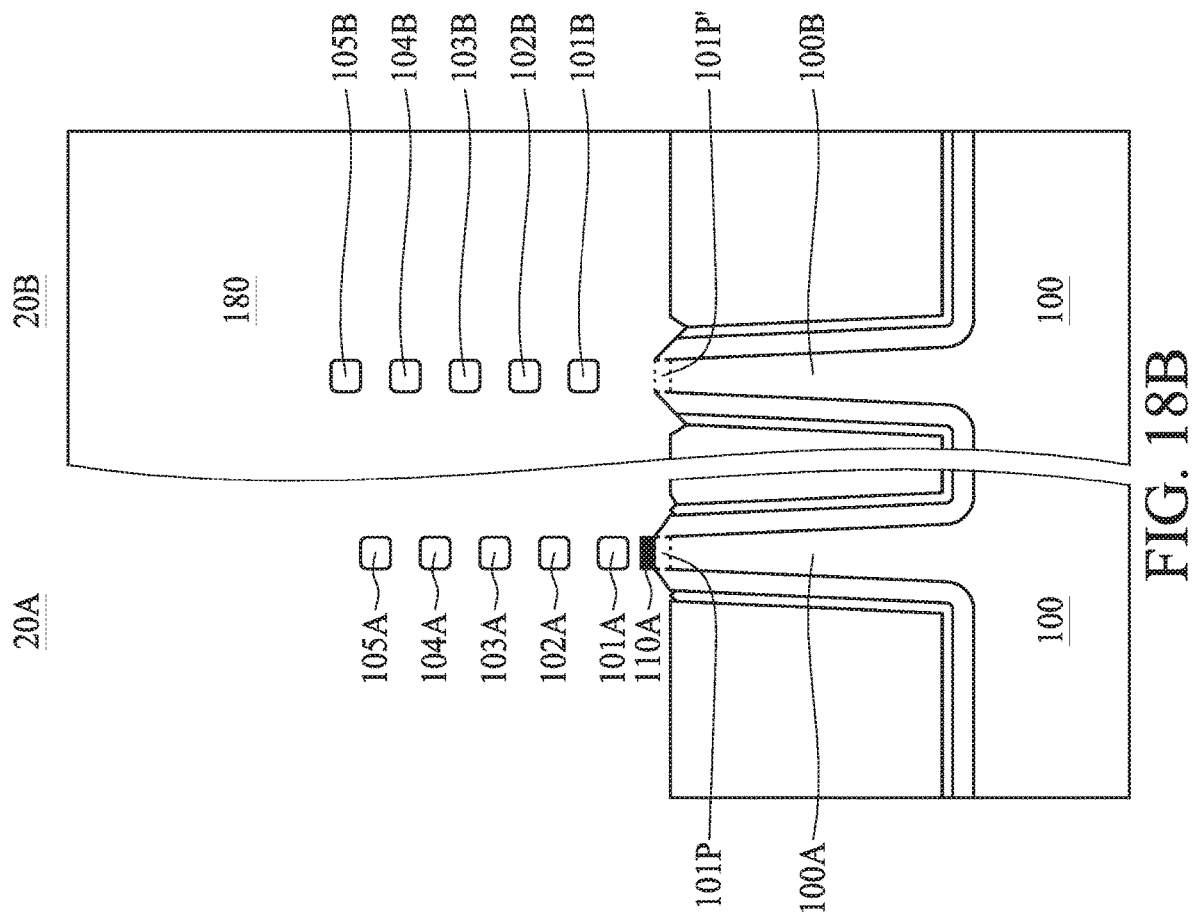

FIG. 17B and FIG. 18B show a second nanowire releasing operation at the channel region in PMOS 20A and NMOS 20B when silicon germanium or carbon-doped silicon germanium is used as the barrier layer 110A, 110B. Comparing to the first nanowire releasing operation, the second nanowire releasing operation is conducted at the channel region, which originally covered by the dummy gate 160, after a dummy gate removal operation, whereas the first nanowire releasing operation is conducted at the source/drain 201A, 201B utilizing the dummy gate 160 as a hard mask. In FIG. 17B, hard mask 170 is disposed over the PMOS 20A and exposing the NMOS 20B to a silicon nanowire releasing operation. As previously discussed, because the barrier layer 110B is composed of silicon germanium or carbon-doped silicon germanium, the barrier layer 110B is removed after the silicon nanowire releasing operation because the etchant utilized to release the Si nanowires 101B, 102B, 103B, 104B, 105B possesses lower selectivity on silicon-based material and greater selectivity on non-silicon-based material, for example, silicon germanium-based materials. Similarly, in FIG. 18B, hard mask 180 is disposed over the NMOS 20B and exposing the PMOS 20A to a silicon germanium nanowire releasing operation. As previously discussed, because the barrier layer 110A is also composed of silicon germanium or carbon-doped silicon germanium, the barrier layer 110A is retained after the silicon germanium nanowire releasing operation because the etchant utilized to release the SiGe nanowires 101A, 102A, 103A, 104A, 105A possesses lower selectivity on silicon germanium-based material and greater selectivity on non-silicon germanium-based material, for example, silicon-based materials.

Figure 19:
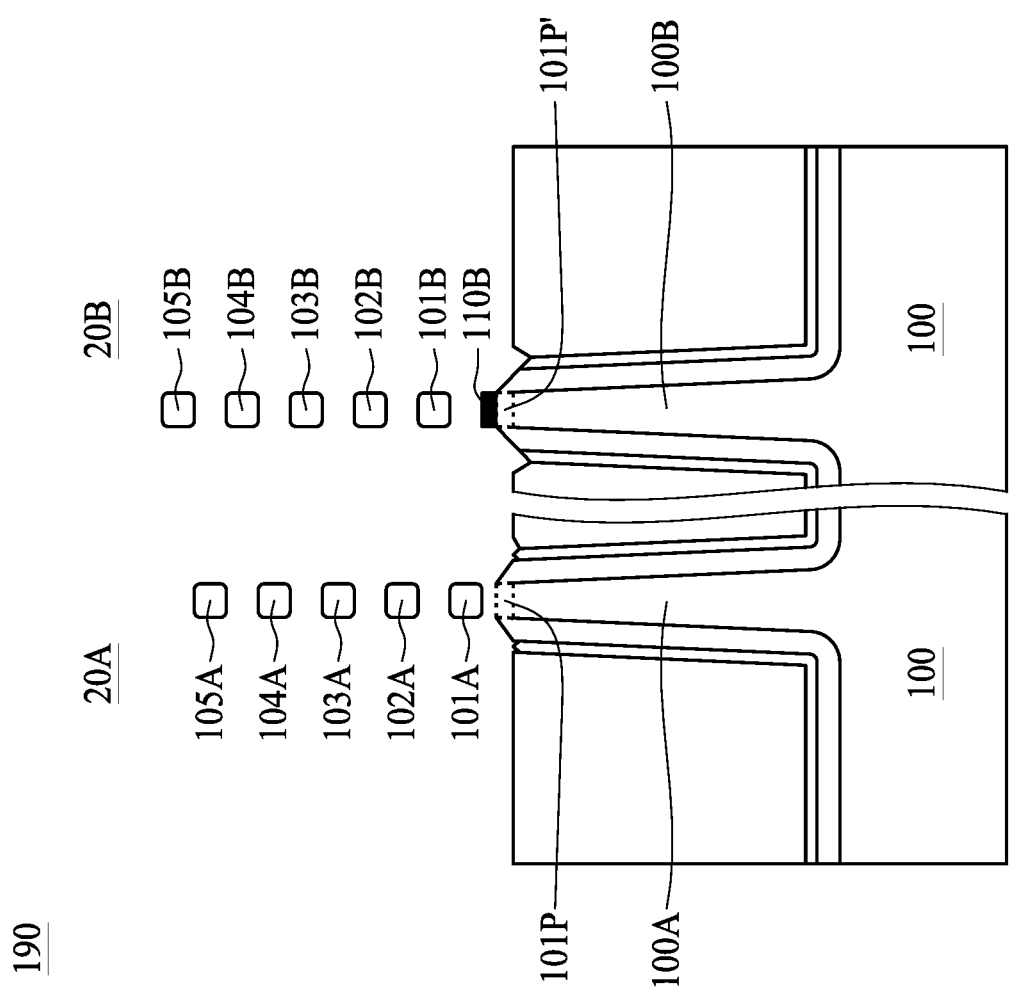

FIG. 19 shows a semiconductor structure 190 after removing the hard mask 180 in FIG. 18A. The NMOS 20B retains the barrier layer 110B over the APT region 101P' whereas the barrier layer 110A in PMOS 20A was removed during second nanowire releasing operation described above. Subsequently, gate materials are deposited to fill the space between adjacent released nanowires as well as the space between the top surface 100T and the bottom SiGe nanowire 101A or bottom Si nanowire 101B. In some embodiments, gate material filling is performed at the PMOS 20A before the NMOS 20B. In other embodiments, gate material filling is performed at the NMOS 20B before the PMOS 20A. In some embodiments, gate material including an interfacial layer material, a high-k dielectric layer, a titanium nitride capping layer, a work function metal layer, and tungsten gate metal can be formed around as well as over the plurality of released nanowires in the PMOS 20A and NMOS 20B.

Figure 20:
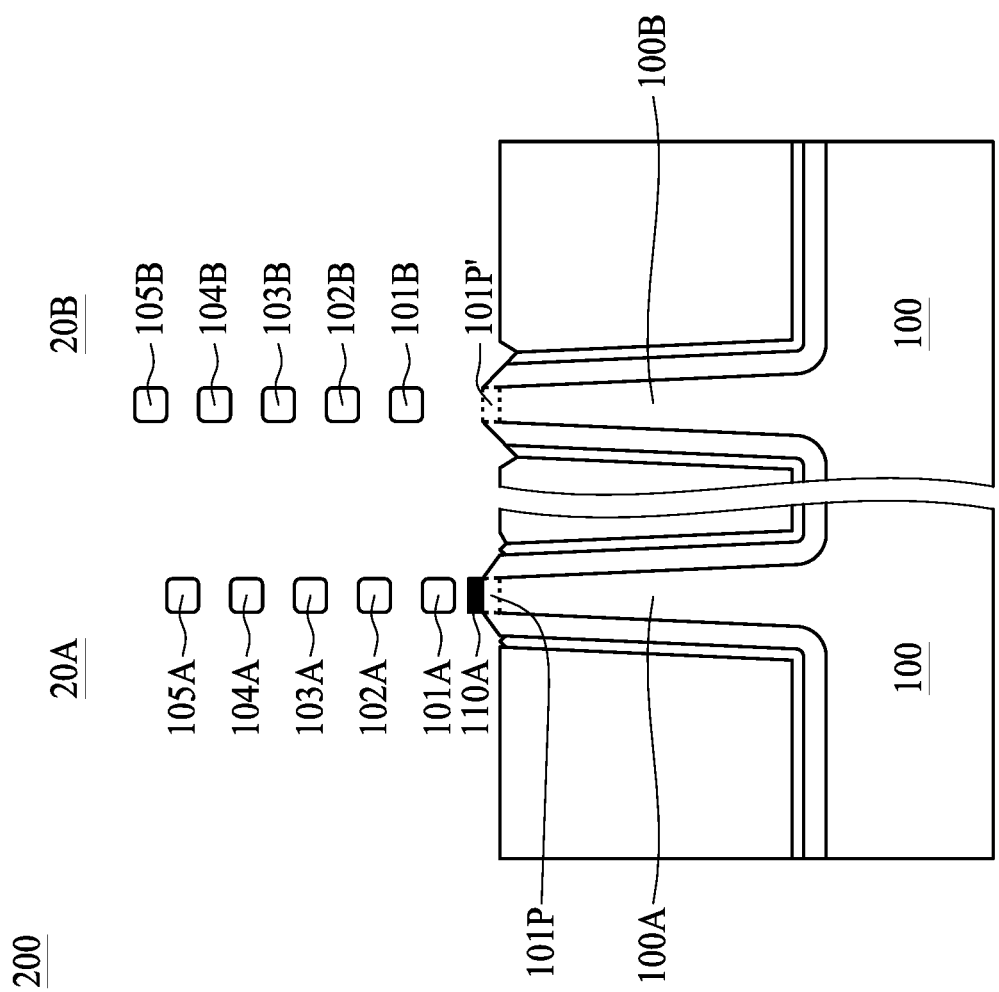

FIG. 20 shows a semiconductor structure 200 after removing the hard mask 180 in FIG. 18B. The PMOS 20A retains the barrier layer 110A over the APT region 101P whereas the barrier layer 110B in NMOS 20B was removed during second nanowire releasing operation described above. Subsequently, gate materials are deposited to fill the space between adjacent released nanowires as well as the space between the top surface 100T and the bottom SiGe nanowire 101A or bottom Si nanowire 101B. In some embodiments, gate material filling is performed at the PMOS 20A before the NMOS 20B. In other embodiments, gate material filling is performed at the NMOS 20B before the PMOS 20A. In some embodiments, gate material including an interfacial layer material, a high-k dielectric layer, a titanium nitride capping layer, a work function metal layer, and tungsten gate metal can be formed around as well as over the plurality of released nanowires in the PMOS 20A and NMOS 20B.

Some embodiments provide a semiconductor structure including a first transistor. The first transistor includes a semiconductor substrate having a top surface and a first anti-punch through region doped with a first conductivity dopant at the top surface. The first transistor further includes a first channel over the top surface of the semiconductor substrate by a first distance. A concentration of the first conductivity dopant at the first channel is lower than a concentration of the first conductivity dopant at the top surface of the semiconductor substrate.

Some embodiments provide a method for manufacturing a semiconductor structure, including (1) forming a first anti-punch through region at a top surface of a semiconductor substrate at a first transistor region; (2) forming a barrier layer over the top surface of the semiconductor substrate at the first transistor region by growing a crystalline layer; and (3) forming a first channel material and second channel material stack over the barrier layer.

Some embodiments provide a method for manufacturing a PMOS structure, including (1) forming an N-well region in a semiconductor substrate; (2) forming an anti-punch through region with n-type dopants in the semiconductor substrate; (3) forming a diffusion barrier layer having a thickness greater than a diffusion length of the n-type dopants over a top surface of the semiconductor substrate; (4) forming a SiGe nanowire channel layer over the diffusion barrier layer; (5) forming a SiGe nanowire channel and removing the diffusion barrier layer under the SiGe nanowire channel.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a semiconductor structure, comprising:
   forming a first anti-punch through region at a top surface of a semiconductor substrate at a first transistor region;
   forming a barrier layer over the top surface of the semiconductor substrate at the first transistor region by growing a crystalline layer;
   forming a first channel material layer and forming a second channel material layer over the barrier layer; and completely removing the barrier layer at the first transistor region.

2. The method of claim 1, further comprising:
forming a second anti-punch through region at a top surface of the semiconductor substrate at a second transistor region; and
forming the barrier layer over the top surface of the semiconductor substrate at the second transistor region simultaneously with forming the barrier layer over the top surface at the first transistor region.

3. The method of claim 2, wherein the first channel material layer is between the barrier layer and the second channel material layer, and the barrier layer comprises materials of the first channel material layer, carbon-doped materials of the first channel material layer, or combinations thereof.

4. The method of claim 3, wherein removing the barrier layer at the first transistor region further comprises:
providing a first masking layer covering the second transistor region and exposing the first transistor region;
removing the first channel material layer and the barrier layer at the first transistor region;
providing a second masking layer covering the second channel material layer at the first transistor region and exposing the second transistor region after the barrier layer at the first transistor region is removed; and
removing the second channel material layer at the second transistor region.

5. The method of claim 2, wherein the first channel material layer is between the barrier layer and the second channel material layer, and the barrier layer comprises materials of the second channel material layer, carbon-doped materials of the second channel material layer, or combinations thereof.

6. The method of claim 5, wherein removing the barrier layer at the first transistor region further comprises:
providing a first masking layer covering the first transistor region and exposing the second transistor region;
removing the first channel material layer at the second transistor region;
providing a second masking layer covering the barrier layer and the second channel material layer at the second transistor region and exposing the first transistor region after the first channel material layer at the second transistor region is removed; and
removing the second channel material layer and the barrier layer at the first transistor region.

7. The method of claim 1, further comprising forming a semiconductor fin structure by patterning the semiconductor substrate, the barrier layer, and the first channel material layer and the second channel material layer.

8. A method for forming a PMOS structure, comprising:
forming an N-well region and a P-well region in a semiconductor substrate;
forming an anti-punch through region with n-type dopants in the N-well region of the semiconductor substrate;
forming a diffusion barrier layer having a thickness greater than a diffusion length of the n-type dopants over a top surface of the semiconductor substrate;
forming a SiGe channel layer over the diffusion barrier layer;
forming a Si channel layer over the SiGe channel layer;
providing a masking layer covering the P-well region in the semiconductor substrate and exposing the N-well region; and
removing a portion of the diffusion barrier layer and a portion of the Si channel layer over the N-well region.

9. The method of claim 8, wherein the diffusion barrier layer comprises silicon or carbon-doped silicon.

10. The method of claim 8, wherein the thickness of the diffusion barrier layer is from about 1 nm to about 10 nm.

11. The method of claim 8, further comprising forming a source/drain region after removing the portion of the diffusion barrier layer.

12. The method of claim 8, further comprising forming a metal gate between the top surface of the semiconductor substrate and the SiGe channel layer after removing the portion of the diffusion barrier layer.

13. The method of claim 8, wherein another portion of the diffusion barrier layer over the P-well region is covered by the masking layer.

14. A method for manufacturing a semiconductor structure, comprising:
forming an anti-punch through region in a semiconductor substrate;
forming a barrier layer over the anti-punch through region;
forming a first channel material layer and a second channel material layer over the barrier layer;
removing the barrier layer and the first channel material layer such that the anti-punch through region is exposed; and
forming a gate surrounding the second channel material layer after the barrier layer is removed.

15. The method of claim 14, further comprising:
forming a P-well region in the semiconductor substrate before the anti-punch through region is formed, wherein the anti-punch through region is formed in the P-well region, and wherein the first channel material layer is between the barrier layer and the second channel material layer.

16. The method of claim 15, wherein the first channel material layer is made of silicon germanium, and the barrier layer is made of silicon germanium or carbon-doped silicon germanium.

17. The method of claim 14, further comprising:
forming an N-well region in the semiconductor substrate before the anti-punch through region is formed, wherein the anti-punch through region is formed in the N-well region, and wherein the second channel material layer is between the barrier layer and the first channel material layer.

18. The method of claim 17, wherein the first channel material layer is made of silicon, and the barrier layer is made of silicon or carbon-doped silicon.

19. The method of claim 14, wherein a portion of the gate is interposed between the anti-punch through region and the second channel material layer.

20. The method of claim 14, further comprising:
forming a sacrificial layer over the semiconductor substrate before the anti-punch through region is formed; and
removing the sacrificial layer before the barrier layer is formed.

* * * * *